US008860171B2

(12) United States Patent
Kitagawa

(10) Patent No.: US 8,860,171 B2
(45) Date of Patent: Oct. 14, 2014

(54) SEMICONDUCTOR DEVICE HAVING DIODE CHARACTERISTIC

(75) Inventor: Mitsuhiko Kitagawa, Tokyo (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 307 days.

(21) Appl. No.: 12/968,188

(22) Filed: Dec. 14, 2010

(65) Prior Publication Data

US 2011/0140180 A1 Jun. 16, 2011

(30) Foreign Application Priority Data

Dec. 15, 2009 (JP) ................................. 2009-284584
Oct. 20, 2010 (JP) ................................. 2010-235063

(51) Int. Cl.
| | | |
|---|---|---|
| H01L 29/66 | (2006.01) | |
| H01L 29/78 | (2006.01) | |
| H01L 29/861 | (2006.01) | |
| H01L 27/06 | (2006.01) | |
| H01L 27/08 | (2006.01) | |
| H01L 29/06 | (2006.01) | |
| H01L 29/20 | (2006.01) | |

(52) U.S. Cl.
CPC .......... *H01L 29/861* (2013.01); *H01L 29/7803* (2013.01); *H01L 29/2003* (2013.01); *H01L 27/0629* (2013.01); *H01L 29/7804* (2013.01); *H01L 29/7813* (2013.01); *H01L 27/0814* (2013.01); *H01L 29/7805* (2013.01); *H01L 29/0634* (2013.01)
USPC .................................. 257/492; 257/E27.051

(58) Field of Classification Search
CPC ............ H01L 27/0814; H01L 29/0634; H01L 29/861; H01L 29/7804; H01L 29/7805
USPC .................. 257/493, 330, 492, 654, E27.016, 257/E27.027, E27.051, E29.257, E29.329, 257/E29.338
See application file for complete search history.

(56) References Cited

U.S. PATENT DOCUMENTS

| | | | | |
|---|---|---|---|---|
| 6,307,246 | B1 * | 10/2001 | Nitta et al. ..................... | 257/493 |
| 7,446,374 | B2 * | 11/2008 | Thorup et al. ................. | 257/330 |
| 7,719,080 | B2 * | 5/2010 | Zhang ............................ | 257/510 |
| 7,804,150 | B2 * | 9/2010 | Jeon et al. ...................... | 257/492 |
| 8,288,839 | B2 * | 10/2012 | Guan et al. ..................... | 257/493 |
| 2002/0027237 | A1 * | 3/2002 | Onishi et al. .................. | 257/262 |
| 2003/0168713 | A1 * | 9/2003 | Narazaki et al. .............. | 257/513 |
| 2004/0238882 | A1 * | 12/2004 | Suzuki et al. ................. | 257/330 |

(Continued)

FOREIGN PATENT DOCUMENTS

| | | |
|---|---|---|
| JP | 06177404 A | 6/1994 |
| JP | 2000-208527 | 7/2000 |

OTHER PUBLICATIONS

Japanese Office Action dated Mar. 7, 2014, filed in Japanese counterpart Application No. 2010-235063, 6 pages (with translation).

Primary Examiner — William F Kraig
Assistant Examiner — Joseph C Nicely
(74) Attorney, Agent, or Firm — Patterson & Sheridan, LLP

(57) ABSTRACT

According to one embodiment, a semiconductor device is provided. The semiconductor device has a first region formed of semiconductor and a second region formed of semiconductor which borders the first region. An electrode is formed to be in ohmic-connection with the first region. A third region is formed to sandwich the first region. A first potential difference is produced between the first and the second regions in a thermal equilibrium state, according to a second potential difference between the third region and the first region.

11 Claims, 31 Drawing Sheets

(56) References Cited

U.S. PATENT DOCUMENTS

| | | | |
|---|---|---|---|
| 2006/0244056 A1* | 11/2006 | Miura | 257/330 |
| 2008/0197407 A1* | 8/2008 | Challa et al. | 257/330 |
| 2009/0179260 A1* | 7/2009 | Kobayashi | 257/330 |
| 2012/0043551 A1* | 2/2012 | Zhu et al. | 257/76 |
| 2012/0178228 A1* | 7/2012 | Koon et al. | 438/238 |

* cited by examiner

FORWARD BIASED
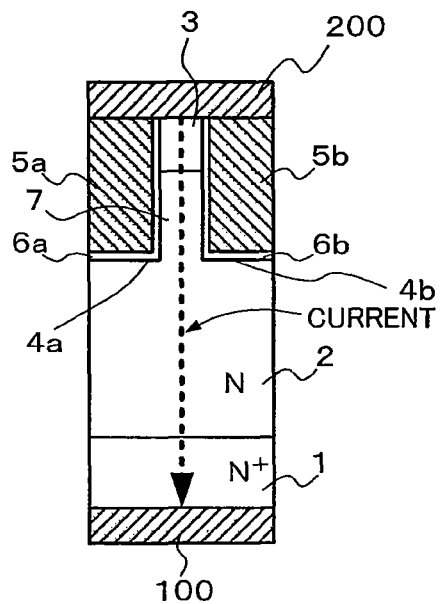
REVERSE BIASED
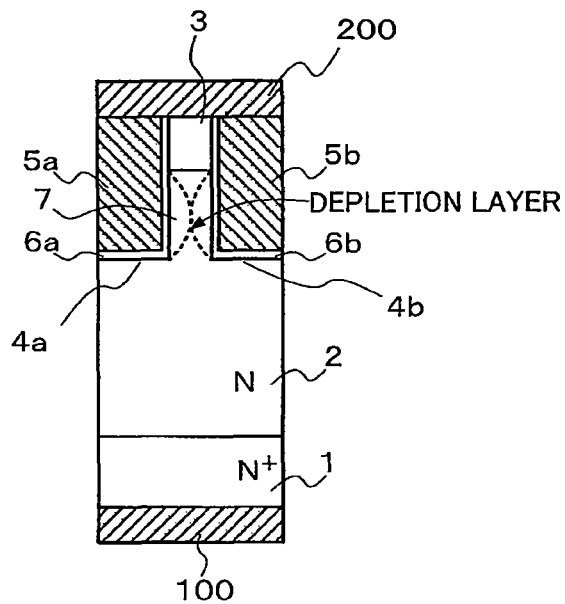
FIG. 3A
FIG. 3B
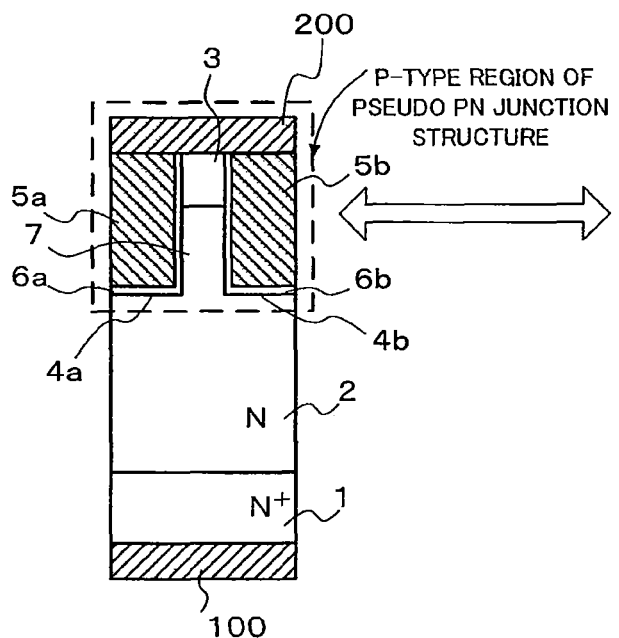
FIG. 3C

SEMICONDUCTOR DEVICE HAVING DIODE CHARACTERISTIC

CROSS-REFERENCE TO RELATED APPLICATION(S)

This application is based upon and claims the benefit of priority from the prior Japanese Patent Application No. 2009-284584, filed on Dec. 15, 2009 and Japanese Patent Application No. 2010-235063, filed on Oct. 20, 2010, the entire contents of which are incorporated herein by reference.

FIELD

Embodiments described herein relate generally to a semiconductor device having a diode characteristic.

BACKGROUND

A diode having a PN junction (hereinafter referred to as "PN diode") and a diode having a Schottky junction (hereinafter referred to as "Schottky diode") are widely known as a semiconductor diode. The PN diode has characteristics of high withstand voltage during turn-off and small reverse leakage current.

In a vertical power semiconductor device, a large current flows between electrodes facing each other. Recently, in the vertical power semiconductor device, a multi RESURF structure is adopted as a technique of enhancing the withstand voltage while reducing on-resistance. The multi RESURF structure is a structure that P-type layers and N-type layers are alternately arranged.

The multi RESURF can provide a compatibility of reducing on-resistance and enhancing withstand voltage in a PiN-type diode, for example.

However, when a silicon substrate is used, a threshold of forward voltage is high because a built-in potential generated by a band gap of a PN junction is as high as about 0.8 V. At the threshold, on-current starts to flow through the PiN-type diode.

On the other hand, as to a Schottky diode, a barrier height of a Schottky electrode and a drift layer can be controlled. Accordingly, a built-in potential of the Schottky diode, i.e. a threshold of the Schottky diode at which on-current starts to flow, can be lowered. A multi RESURF structure to be employed in a Schottky diode has been proposed.

However, leakage current increases in the Schottky diode significantly when withstand voltage is enhanced.

BRIEF DESCRIPTION OF THE DRAWINGS

FIGS. 3A and 3B are sectional views for explaining an operation of the semiconductor device according to the first embodiment;

FIG. 3C is a view for explaining a concept of a structure of the semiconductor device according to the first embodiment;

DETAILED DESCRIPTION

Figure 1:
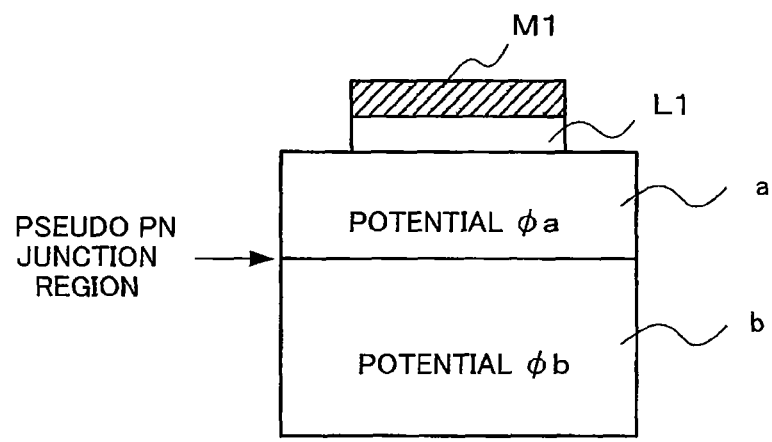
FIG. 1 is a conceptual view of a structure provided in semiconductor devices according to embodiments.

A concept of a structure to be provided in semiconductor devices of embodiments will be described with reference to FIG. 1.

Conceptually, the structure of the semiconductor devices is provided with a main electrode M1, an ohmic contact layer L1, a region "a", and a region "b". The ohmic contact layer L1 is in ohmic contact with the main electrode M1. The region "a" is ohmic-connected to the main electrode M1. A potential $\phi a$ of the region "a" in a thermal equilibrium state is externally controlled. The region "b" is formed so as to border the region "a". A potential $\phi b$ of the region "b" in the thermal equilibrium differs from the potential $\phi a$ of the region "a" in the thermal equilibrium. Between the regions "a", "b", a pseudo PN junction region exists.

Hereinafter, a potential in a thermal equilibrium state is mentioned as "a potential" simply.

In the above conceptual structure of the semiconductor device, the potential $\phi a$ of the region "a" can be changed so that the difference ($\phi b - \phi a$) between the potential $\phi b$ of the region "b" and the potential $\phi a$ of the region "a" is decreased below the built-in voltage which depends on a band gap of a semiconductor material used for the semiconductor device.

According to one of the embodiments, a semiconductor device is provided. The semiconductor device has a first region formed of semiconductor and a second region formed of semiconductor which borders the first region. An electrode is formed to be in ohmic-connection with the first region. A third region is formed to sandwich the first region. A first potential difference is produced between the first and the second regions in a thermal equilibrium state, according to a second potential difference between the third region and the first region.

According to another one of the embodiments, a semiconductor device is provided. An anode electrode and a cathode electrode are arranged with an interval provided between the electrodes. A first-conductivity type cathode layer has a lower impurity concentration. The cathode layer is formed on the cathode electrode. A first-conductivity type drift layer is formed on the cathode layer. A portion of the drift layer on the anode electrode side has a plurality of trenches formed at intervals and has semiconductor regions. Each of the semiconductor regions is located between ones of the trenches adjacent to each other. A plurality of insulating films is formed on inner walls of the trenches respectively. A plurality of buried electrodes is provided in the trenches. The buried electrodes and the inner walls of the trenches sandwich the insulating films respectively. First-conductivity type layers and second-conductivity type layers are provided between the semiconductor regions and the anode electrode and alternately. The first-conductivity type layers have a higher impurity concentration. The second-conductivity type layers have a higher impurity concentration.

According to further another one of the embodiments, a semiconductor device is provided. An anode electrode and a cathode electrode are arranged with an interval provided between the electrodes. A first-conductivity type cathode layer is formed on the cathode electrode. A drift layer is formed on the cathode layer. The drift layer has first layers of the first-conductivity type and second layers of a second-conductivity type arranged alternately in a direction in which the cathode layer extends. Third layers of the first-conductivity type and fourth layers of the second-conductivity type are provided between the drift layer and the anode electrode and arranged alternately. The third layers and fourth layers have impurity concentrations different from those of the first layers and the second layers. One ends of the third layers and fourth layers are formed on the first layers and the second layers so as to correspond to each position of the first layers and the second layers. The other ends of the third layers and fourth layers are formed on the anode electrode.

According to yet another one of the embodiments, a semiconductor device having a GaN substrate is provided. An AlGaN-type layer is formed on the GaN substrate. An anode electrode and a cathode electrode are formed on the AlGaN-type layer with an interval provided between the electrodes. A plurality of first trenches is formed at intervals so as to extend from the AlGaN-type layer to the GaN substrate.

Insulating films are formed on inner walls of the first trenches. A plurality of first buried electrodes is formed in the first trenches respectively. The insulating films are interposed between the first buried electrodes and the inner walls of the first trenches.

A second trench may be formed in a portion of the AlGaN-type layer between ones of the first trenches. An insulating film may be formed on an inner wall of the second trench. A second buried electrode may be formed in the second trench with an insulating film interposed between the second buried electrode and the inner wall of the second trench.

Hereinafter, other ones of the embodiments will be described with reference to the drawings.

Figure 2:
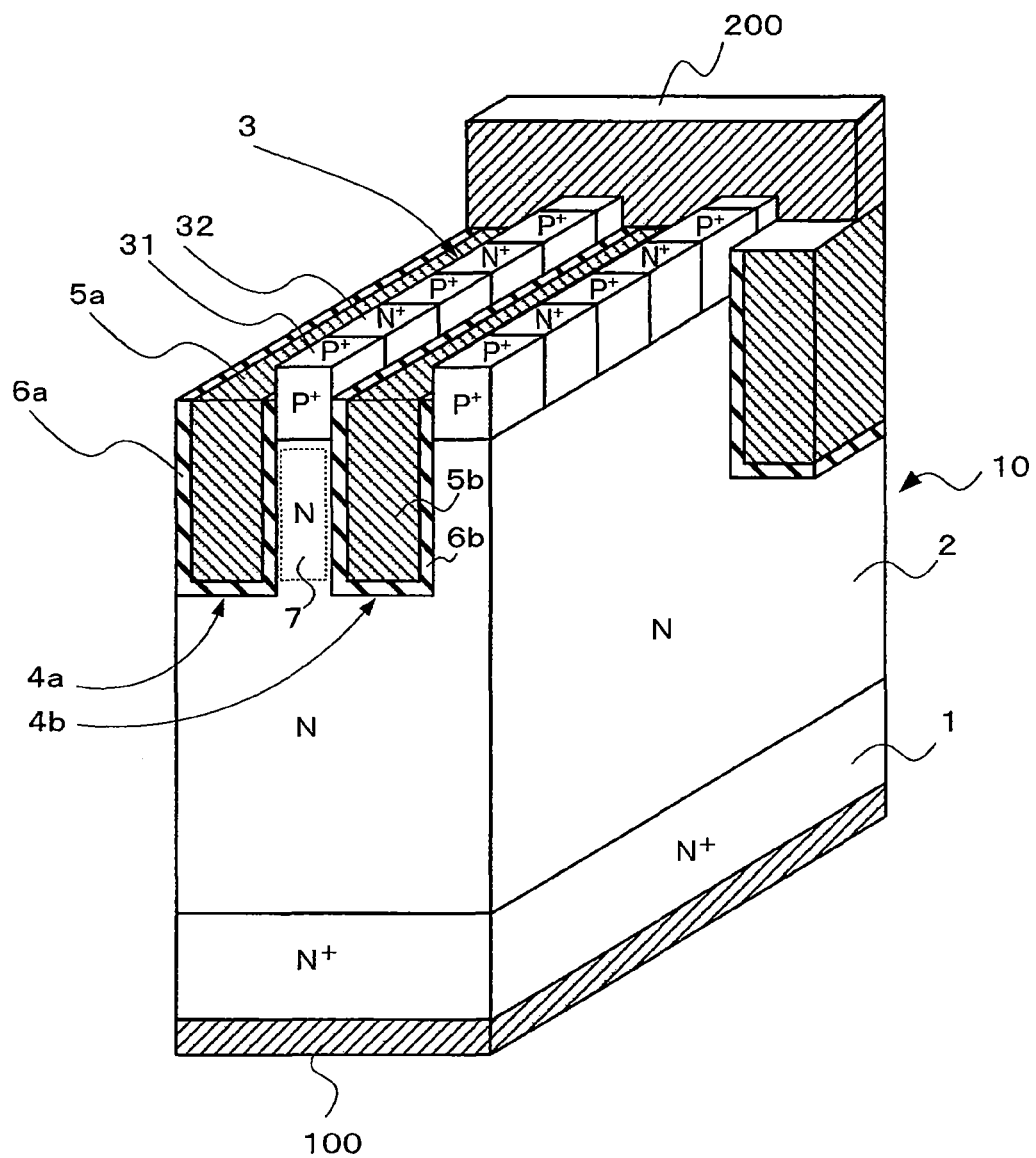
FIG. 2 is a perspective view schematically illustrating a configuration of a semiconductor device according to a first embodiment.

A first embodiment will be described with reference to FIG. 2. FIG. 2 is a perspective view schematically illustrating a configuration of a semiconductor device according to the first embodiment. FIG. 2 shows a section of the semiconductor device partially.

The semiconductor device of the first embodiment is vertically formed on a silicon substrate 10. A cathode electrode 100 formed of metal and an anode electrode 200 formed of metal are provided at both ends of the silicon substrate 10. The semiconductor device indicates a diode characteristic in accordance with a direction of a voltage to be applied between the cathode electrode 100 and the anode electrode 200.

In the semiconductor device, an N$^+$-type cathode layer 1 is formed on the cathode electrode 100. An N-type drift layer 2 having a low impurity concentration is formed on the cathode layer 1. Trenches 4a, 4b, . . . are arranged at predetermined intervals in an upper portion of the drift layer 2. Buried electrodes 5a, 5b, . . . are formed in the trenches respectively. Insulating films 6a, 6b, . . . are respectively interposed between the buried electrodes and the trenches. An upper surface of the buried electrode is in contact with the anode electrode 200, and the buried electrode is electrically connected to the anode electrode 200. Although the trenches 4a, 4b, the buried electrodes 5a, 5b, the insulating film 6a, 6b and the surrounding are typically described below, other trenches, buried electrodes, insulating films and the surrounding have similar configurations.

A region 7 is formed between the trenches 4a, 4b adjacent to each other. A universal contact layer 3 is formed so as to be in contact with the region 7. P+ layers 31 having high impurity concentrations and N+ layers 32 having high impurity concentrations are alternately arranged in the universal contact layer 3. The universal contact layer 3 is in ohmic-connection with the anode electrode 200.

In the semiconductor device of the first embodiment, the materials of the buried electrodes 5a, 5b and the insulating film 6a, 6b, for example, are selected so as to have predetermined potentials with respect to a potential of a semiconductor material, as described below. Depletion layers can be formed or eliminated around the trenches 4a, 4b by changing a voltage to be applied to the anode electrode 200. The buried electrodes 5a, 5b may be made of polysilicon.

In the first embodiment, the interval between the trenches 4a, 5b is set to 200 nm or less, for example, such that the depletion layers overlap each other partially when the depletion layers are formed around the trenches 4a, 4b. Each of the trenches 4a, 4b has a depth of about 1.0 μm. When such a trench interval is determined so that the depletion layers are formed around the trenches 4a, 4b, the region 7 is pinched off by the depletion layers extending from the trenches 4a, 4b which are located on the side surface sides of the region 7.

On the other hand, the region 7 forms a current passage when the depletion layers around the trenches 4a, 4b are eliminated.

Assuming that $\phi a$ is a potential of the inter-trench region 7 in the thermal equilibrium state, the potential $\phi a$ is determined by the conductivity type or impurity concentration of the region 7, the materials of the buried electrodes 5a, 5b and the insulating films 6a, 6b, the interval between the trenches 4a, 4b, or the voluntary combination.

On the other hand, assuming that $\phi b$ is the potential of the drift layer 2 bordering the region 7 in the thermal equilibrium state, the potential $\phi b$ is constant.

Accordingly, assuming that a potential difference $\Delta(\Delta=\phi b-\phi a)$ is a difference between the potential $\phi b$ and the potential $\phi a$, the potential difference $\Delta$ can be changed by determining the conductivity type or impurity concentration of the inter-trench region 7, the materials of the buried electrodes 5a, 5b and the insulating films 6a, 6b, the interval between the trenches 4a, 4b, or the voluntary combination.

When the potential difference $\Delta$ is set lower than the built-in voltage of the semiconductor material, the forward threshold voltage of the semiconductor device can be decreased below a value given by the built-in voltage during formation of a current passage in the inter-trench region 7.

The threshold given by a built-in voltage Vbi is 0.8 V when silicon is used as the semiconductor material, for example. In this case, when the potential difference $\Delta$ is set to a range of 0V<$\Delta$<Vbi/2, for example, the threshold can be decreased below 0.4 V during formation of a current passage in the inter-trench region 7.

When a forward bias is applied to the semiconductor device of the first embodiment, forward current flows through the inter-trench region 7 with a threshold lower than a value given by the built-in voltage of the PN junction as illustrated in FIG. 3A. A voltage higher than that of the cathode electrode is provided to the anode electrode 200 and the buried electrodes 5a, 5b so that a forward bias is applied to the anode electrode 200 and the buried electrodes 5a, 5b.

On the other hand, when a reverse bias is applied to the semiconductor device, the inter-trench region 7 is pinched off by the depletion layers extending from the trenches 4a, 4b as illustrated in FIG. 3B. A voltage lower than that of the cathode electrode is provided to the anode electrode 200 and to the buried electrodes 5a, 5b so that the reverse bias is applied to the anode electrode 200 and to the buried electrodes 5a, 5b.

The above operation is similar to an operation of a PN junction portion of the normal diode. In FIG. 3C, the semiconductor device of the first embodiment is contrasted with the structure of the normal diode. In FIG. 3C, a region surrounded by a dotted line in the semiconductor device of the first embodiment may be regarded as a P-type region constituting the PN junction conceptually. Hereinafter, the structure of the semiconductor device is referred to as a pseudo PN junction structure.

Figure 4:
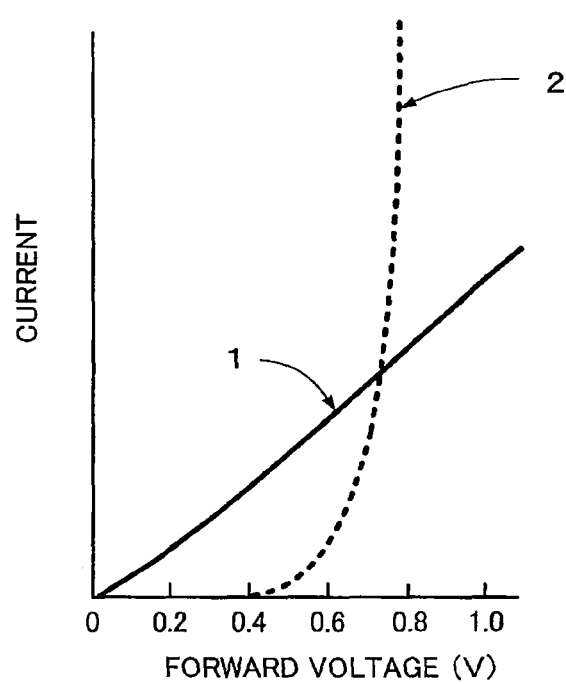
FIG. 4 is a view illustrating a simulation result as to a forward voltage-current characteristic of the semiconductor device according to the first embodiment.

In FIG. 4, an example of a forward voltage-current characteristic of the semiconductor device of the first embodiment is shown by a solid line 1. In FIG. 4, an example of a forward voltage-current characteristic of a conventional PN-type diode is also shown by a curved line 2 in order to compare with the solid line 1.

In the conventional PN-type diode, the forward current flows when the forward voltage becomes about 0.6 V or more as shown by the curved line 2. On the other hand, in the semiconductor device of the first embodiment, the forward current flows even if the forward voltage is 0.4 V or less as shown by the solid line 1.

Figure 5:
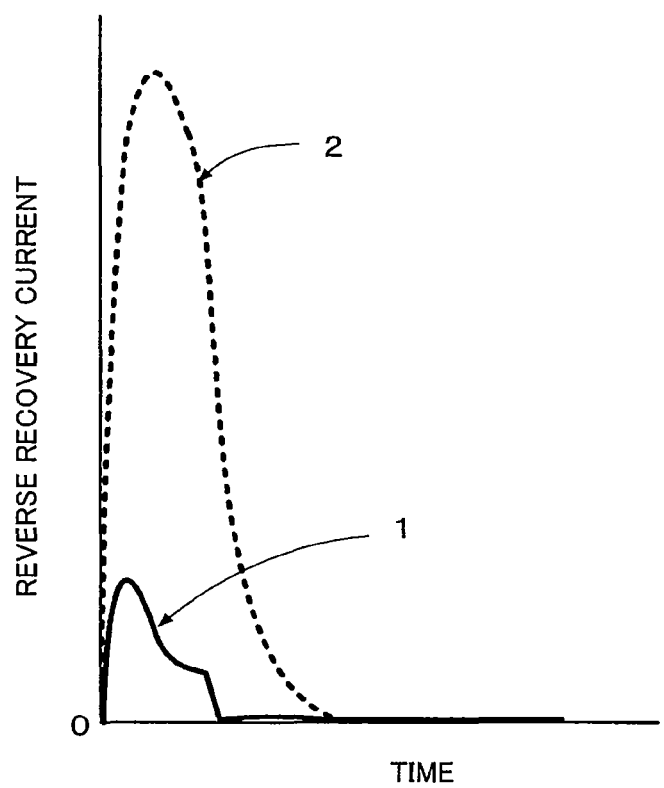
FIG. 5 is a view illustrating a simulation result as to a reverse recovery current characteristic of the semiconductor device according to the first embodiment.

FIG. 5 is a view illustrating an example of a reverse recovery current characteristic of the semiconductor device of the first embodiment.

In a conventional PiN-type diode, when a forward bias is applied, holes are injected from a P-type anode layer into an N-type drift layer, and electrons are injected from an N-type cathode layer into the N-type drift layer, in order to satisfy an electrically neutral condition. The holes and electrons are accumulated as excess carriers in the N-type drift layer. When the conventional PiN-type diode transitions from the forward bias state to a reverse bias state, the large reverse recovery current flows transiently as shown by a curved line 2 in FIG. 5 until the excess carriers accumulated in the N-type drift layer disappear.

On the other hand, in FIG. 5, a reverse recovery current of the first embodiment is, shown by a solid line 1. The reverse recovery current of the first embodiment is extremely small. This is because an extremely small number of holes are injected from the inter-trench region 7 into the N-type drift layer 2 in the first embodiment.

In the first embodiment, since the reverse recovery current is small, the power loss is low when the semiconductor device transitions to the reverse bias state so that the withstand voltage of the semiconductor device can be improved.

As described above, in the semiconductor device of the first embodiment, the conductivity type or impurity concentration of the inter-trench region 7, the material of the buried electrodes 5a, 5b, the material of the insulating films 6a, 6b, or the interval between the trenches 4a, 4b can be selected so that the potential $\phi a$ of the inter-trench region 7 in the thermal equilibrium state is changed. As a result, the threshold voltage of the semiconductor device can be decreased below the value caused by the built-in voltage of a semiconductor material.

FIGS. 6 to 9 are perspective views schematically illustrating semiconductor devices of modifications of the first embodiment. FIGS. 6 to 9 partially illustrate sections of the semiconductor devices. The modifications illustrated in FIGS. 6 to 9 differ from the semiconductor device of the first embodiment illustrated in FIG. 2 in combination of the conductivity type or impurity concentration of the inter-trench region 7, the materials of the buried electrodes 5a, 5b and the insulating films 6a, 6b, or the interval between the trenches 4a, 4b.

Figure 6:
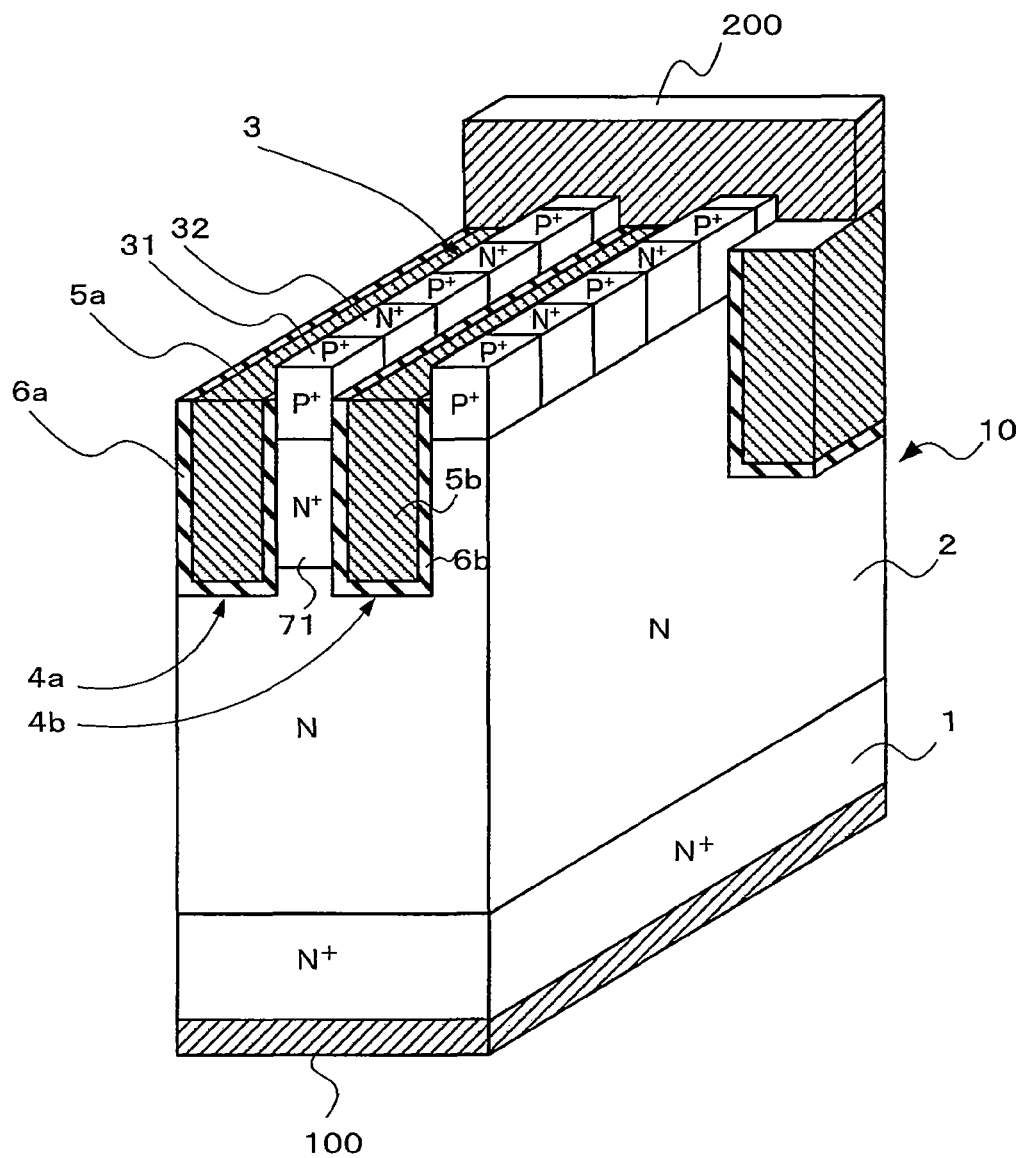
FIG. 6 is a perspective view schematically illustrating a configuration of a semiconductor device according to a modification of the first embodiment.
Figure 7:
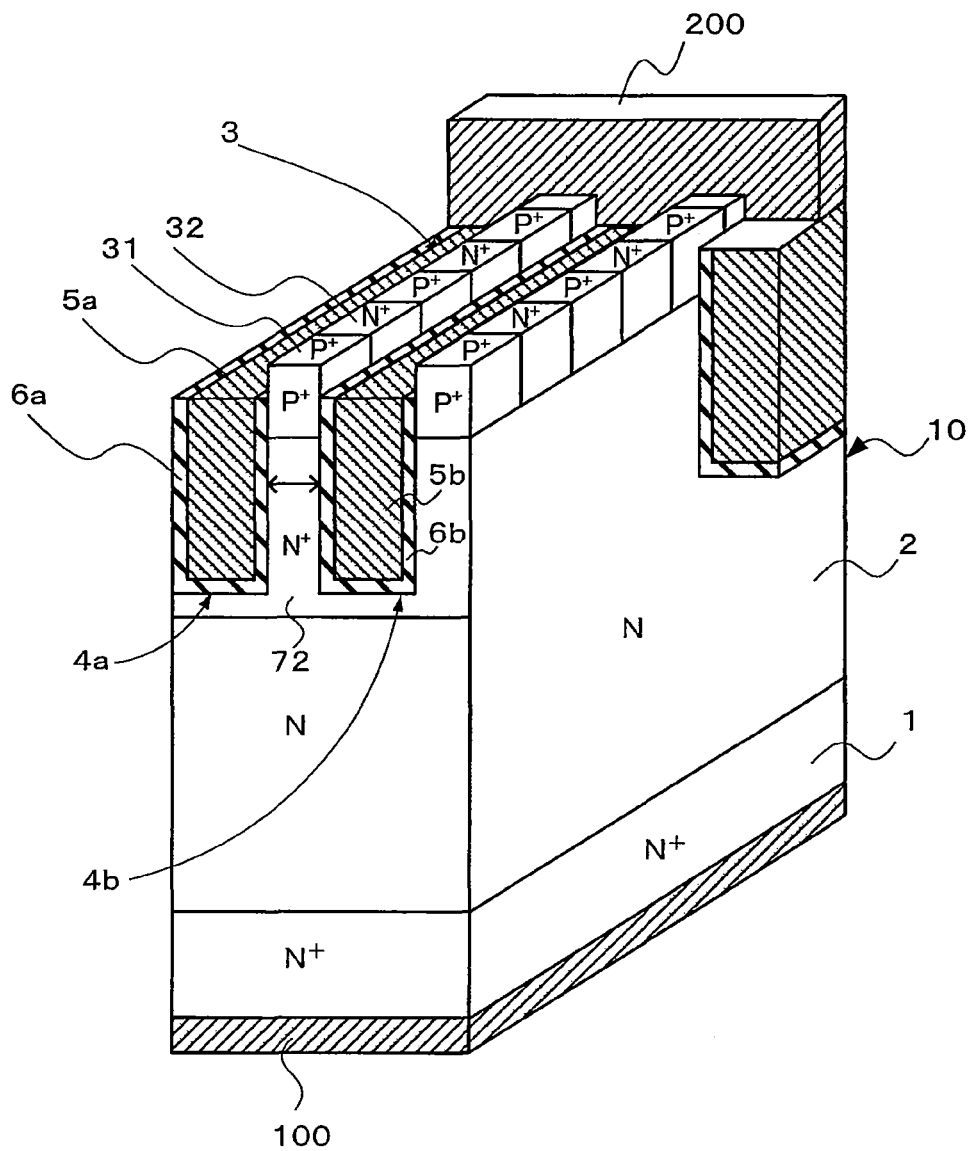
FIG. 7 is a perspective view schematically illustrating the configuration of the semiconductor device according to another modification of the first embodiment.

In respective FIGS. 6 and 7, N$^+$-type regions 71, 72 are provided between the trenches. The regions 71, 72 have impurity concentrations higher than that of the inter-trench region 7 formed in the semiconductor device of the first embodiment illustrated in FIG. 2. As illustrated in FIG. 7, an N$^+$ layer constituting the inter-trench region 72 is spread toward the side of a drift layer 2 when the interval between the trenches 4a, 4b is narrowed. It is because current flows less with decrease of an interval between trenches 4a, 4b.

Figure 8:
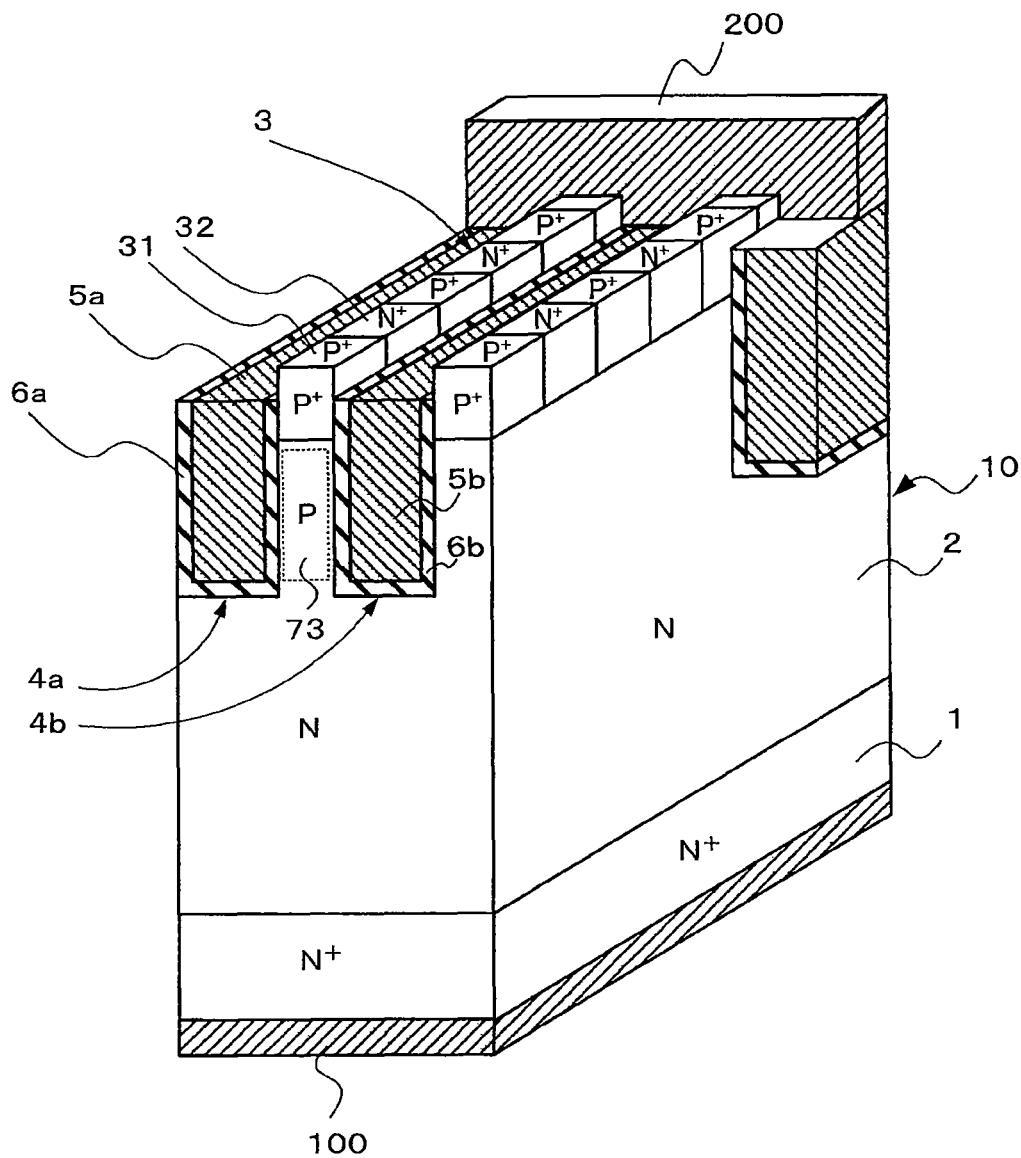
FIG. 8 is a perspective view schematically illustrating the configuration of the semiconductor device according to further another modification of the first embodiment.

FIG. 8 illustrates another modification that the conductivity type of an inter-trench region 73 is P-type. According to the modification, the withstand voltage substantially same as that of a normal PN junction can be realized, even if the impurity concentration of the region 73 between P-type trenches is much lower than the impurity concentration with which the withstand voltage of a normal PN junction is realized. Further, the semiconductor device of the modification illustrated in FIG. 8 can be designed such that the forward threshold lower than that of the normal PN junction is simultaneously realized.

Figure 9:
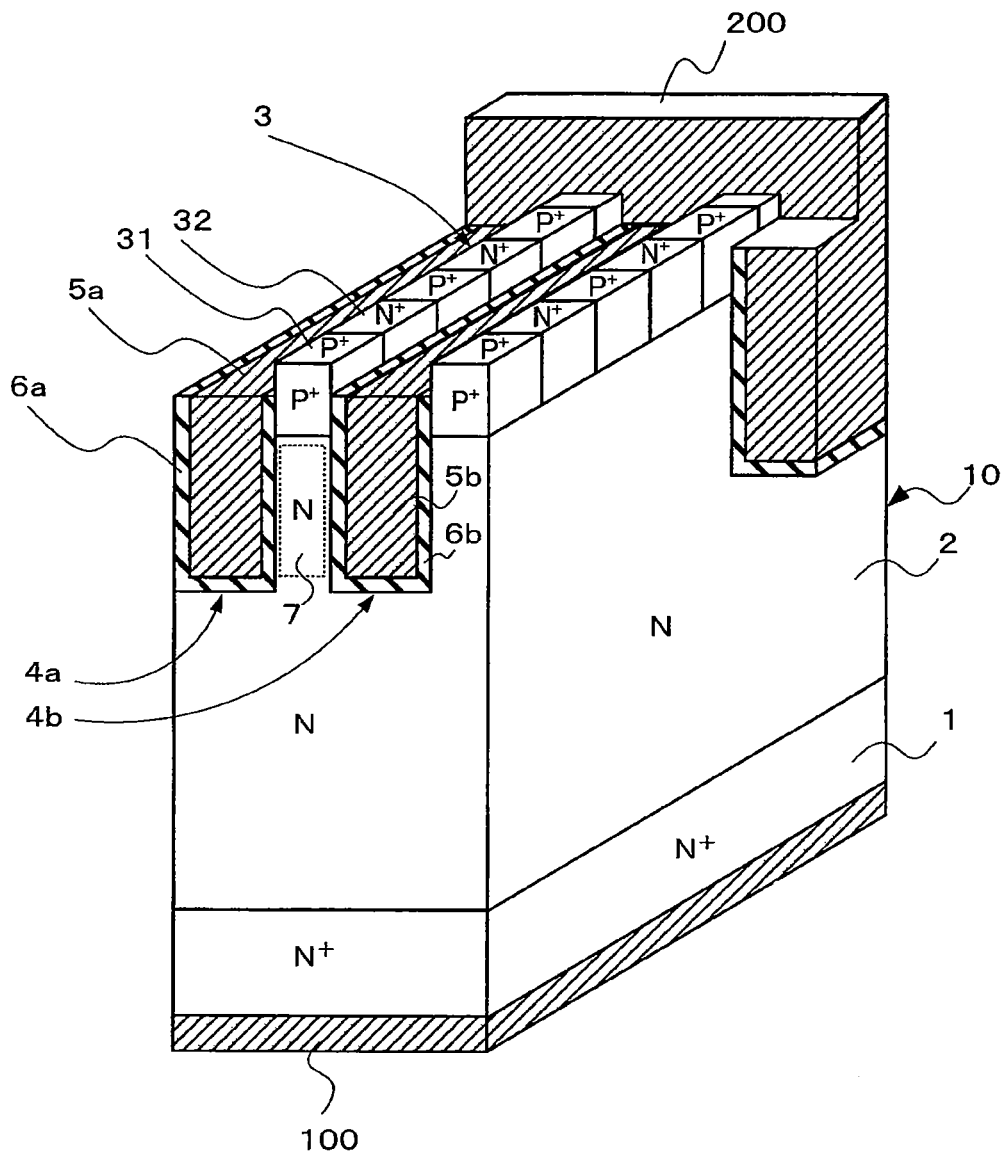
FIG. 9 is a perspective view schematically illustrating the configuration of the semiconductor device according to yet another modification of the first embodiment.

In further another modification illustrated in FIG. 9, buried electrodes 5a, 5b are made of the same metal as that of an anode electrode 200.

Figure 10:
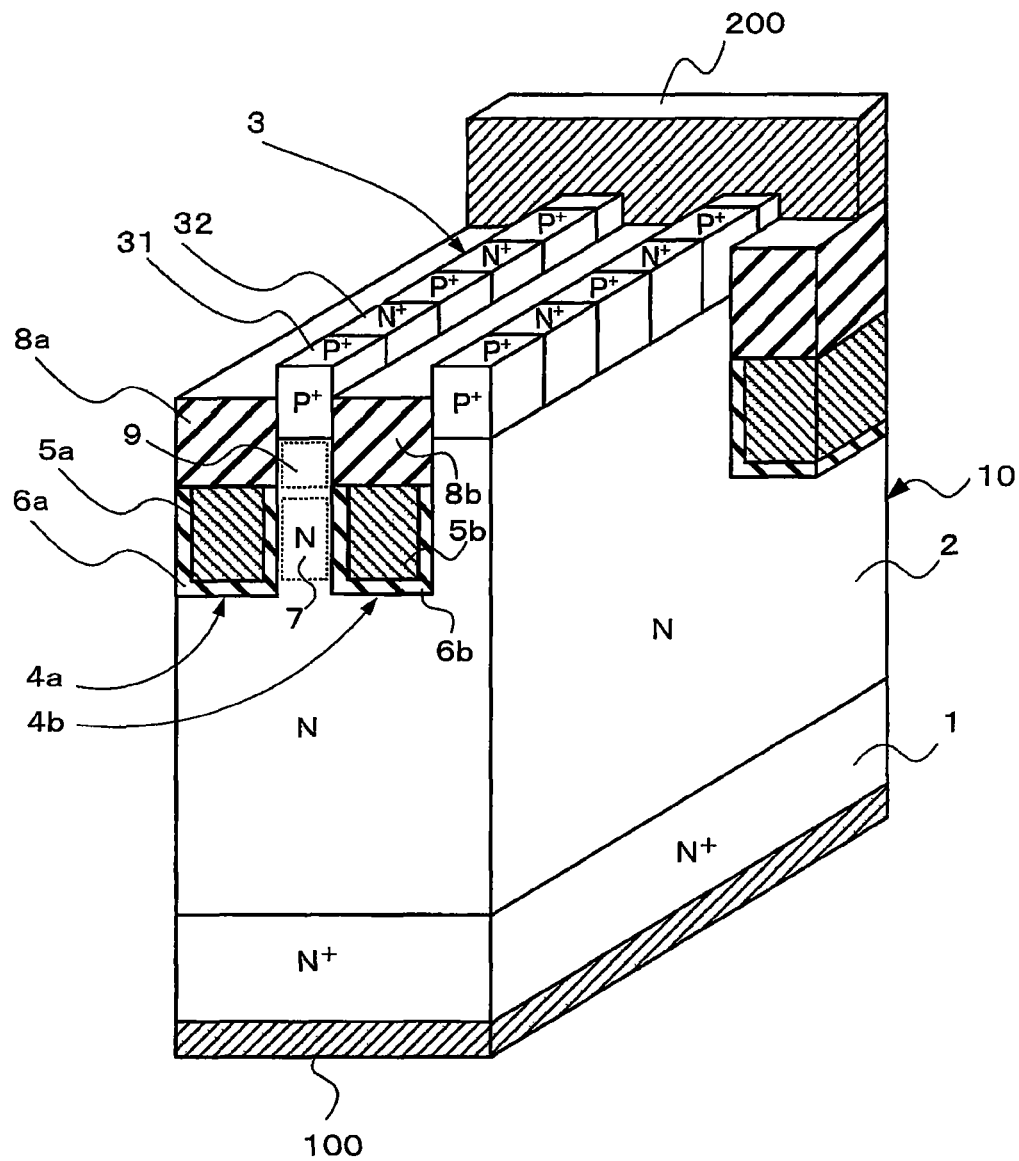
FIG. 10 is a perspective view schematically illustrating a configuration of a semiconductor device according to further another modification of the first embodiment.

FIG. 10 shows yet another modification that insulating layers 8a, 8b are provided on upper surfaces of buried electrodes 5a, 5b. An inter-insulator region 9 sandwiched between the insulating layers 8a, 8b is formed on an upper surface of the inter-trench region 7.

FIG. 10 is a perspective view schematically illustrating a semiconductor device according to the modification. FIG. 10 partially illustrates a section of the semiconductor device.

In the case of the structure illustrated in FIG. 10, assuming that $\phi c$ is a potential of a region 9 between the insulating layers 8a, 8b, the potential difference $\Delta$ between the region 9 and the drift layer 2 is expressed by $\Delta = \phi b - \phi a + \phi c$.

According to the first embodiment and the modifications described above, a threshold voltage lower than a built-in voltage of a semiconductor material can be set by combining a structural condition and a physical property condition. The structural condition is an interval between trenches or the shape of an inter-trench region, for example. The physical property condition is a conductivity type or an impurity concentration of the inter-trench region, or the materials of the buried electrodes or the insulating films, for example. Additionally, the reverse withstand voltage can be enhanced because of a small reverse recovery current.

A second embodiment of the invention will be described with reference to FIGS. 11 to 17.

Figure 11:
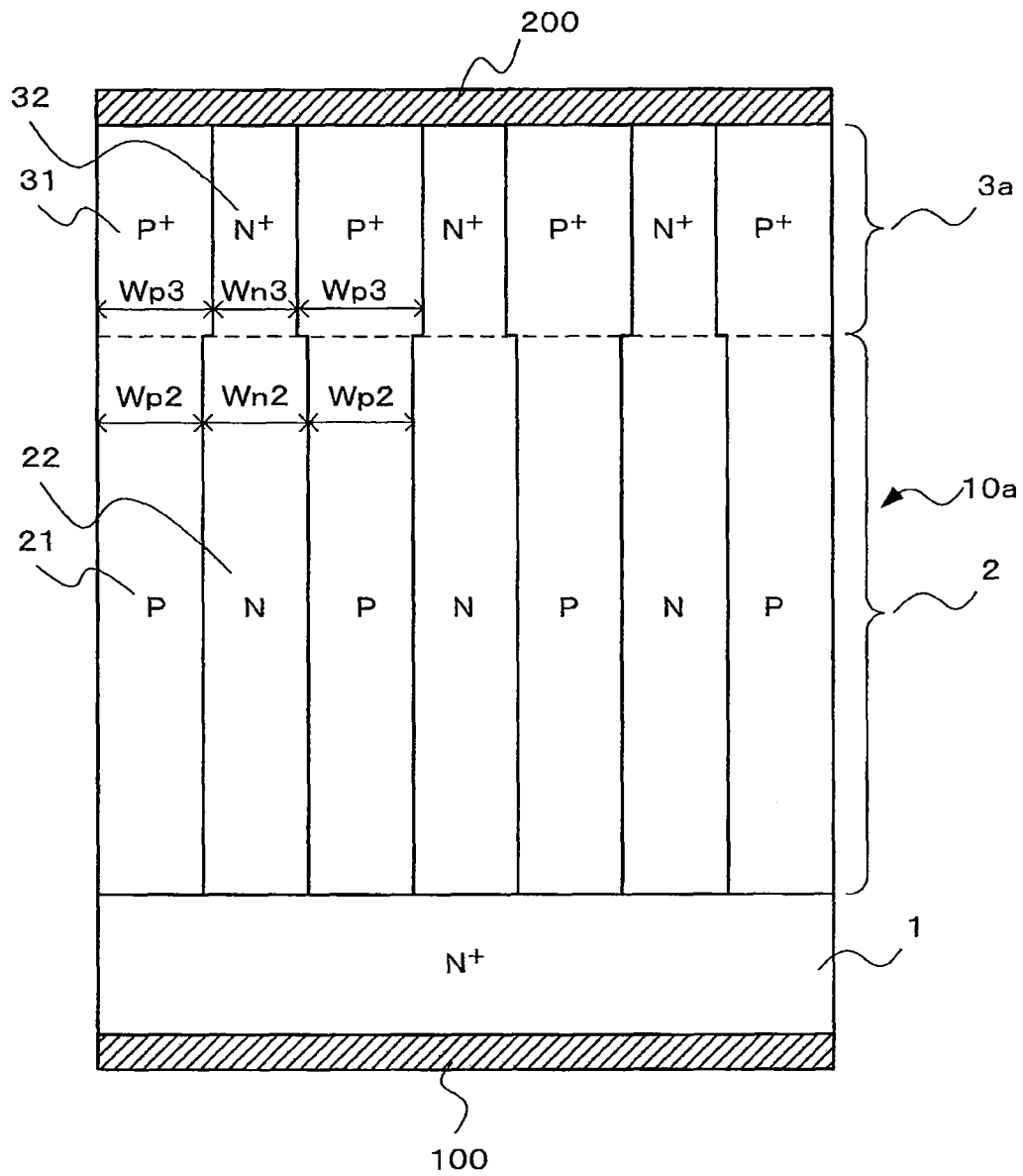
FIG. 11 is a perspective view schematically illustrating a configuration of a semiconductor device according to a second embodiment.

FIG. 11 is a sectional view schematically illustrating a configuration of a semiconductor device according to the second embodiment. FIG. 11 illustrates a vertical section of a semiconductor substrate 10a. The semiconductor device of the second embodiment includes a cathode electrode 100, an N$^+$-type cathode layer 1, a drift layer 2, an anode layer 3a, and an anode electrode 200. The cathode layer 1 is formed on the cathode electrode 100. The drift layer 2 is formed on the cathode layer 1 such that P-type layers 21 having low impurity concentrations and N-type layers 22 having low impurity concentrations are alternately arranged. An anode layer 3a is formed on the drift layer 2.

The anode electrode 200 is provided on the anode layer 3a. The anode layer 3a is formed such that P$^+$ layers 31 having high impurity concentrations and N$^+$ layers 32 having high impurity concentrations are alternately arranged. The P$^+$ layers 31 and the N$^+$ layers 32 are disposed so as to correspond to positions of the P-type layers 21 and N-type layers 22. One end of each of the P$^+$ layers 31 is formed on each of the P-type layers 21, and the other end is in contact with the anode electrode 200. One end of each of the N$^+$ layers 32 is formed on each of the N-type layers 22, and the other end is in contact with the anode electrode 200. The anode layer 3a acts as a universal contact which is in ohmic connection with the anode electrode 200.

The P-type layers 21 and N-type layers 22 constituting the drift layer 2 have the same impurity concentration substantially. Assuming that Wp2 and Wn2 are widths in the arrangement directions of each of the P-type layers 21 and each of the N-type layers 22, the P-type layers 21 and the N-type layers 22 are formed such that the widths Wn2, Wp2 become substantially equal to each other.

The P$^+$ layers 31 and N$^+$ layers 32 constituting the anode layer 3a have the same impurity concentration substantially. Assuming that Wp3 and Wn3 are widths in the arrangement directions of each of the P$^+$ layers 31 and each of the N$^+$ layers 32, the P$^+$ layers 31 and N$^+$ layers 32 are formed such that the widths Wn3, Wp3 become Wn3<Wp3. The width Wn3 of each of the N$^+$ layers 32 is formed in an extremely narrow range of 0.1 to 0.2 μm. The width Wp3 of each of the P$^+$ layers 31 is formed wider than the width Wn3 of each of the N$^+$ layers 32 by about 10 to about 20%.

The widths of the layers 21, 22, 31 and 33 of the drift layer 2 and anode layer 3a can be set to desired values by adjusting shapes of mask patterns which are used to implant impurity ions to form the layers 21, 22, 31 and 33, for example.

Figure 12:
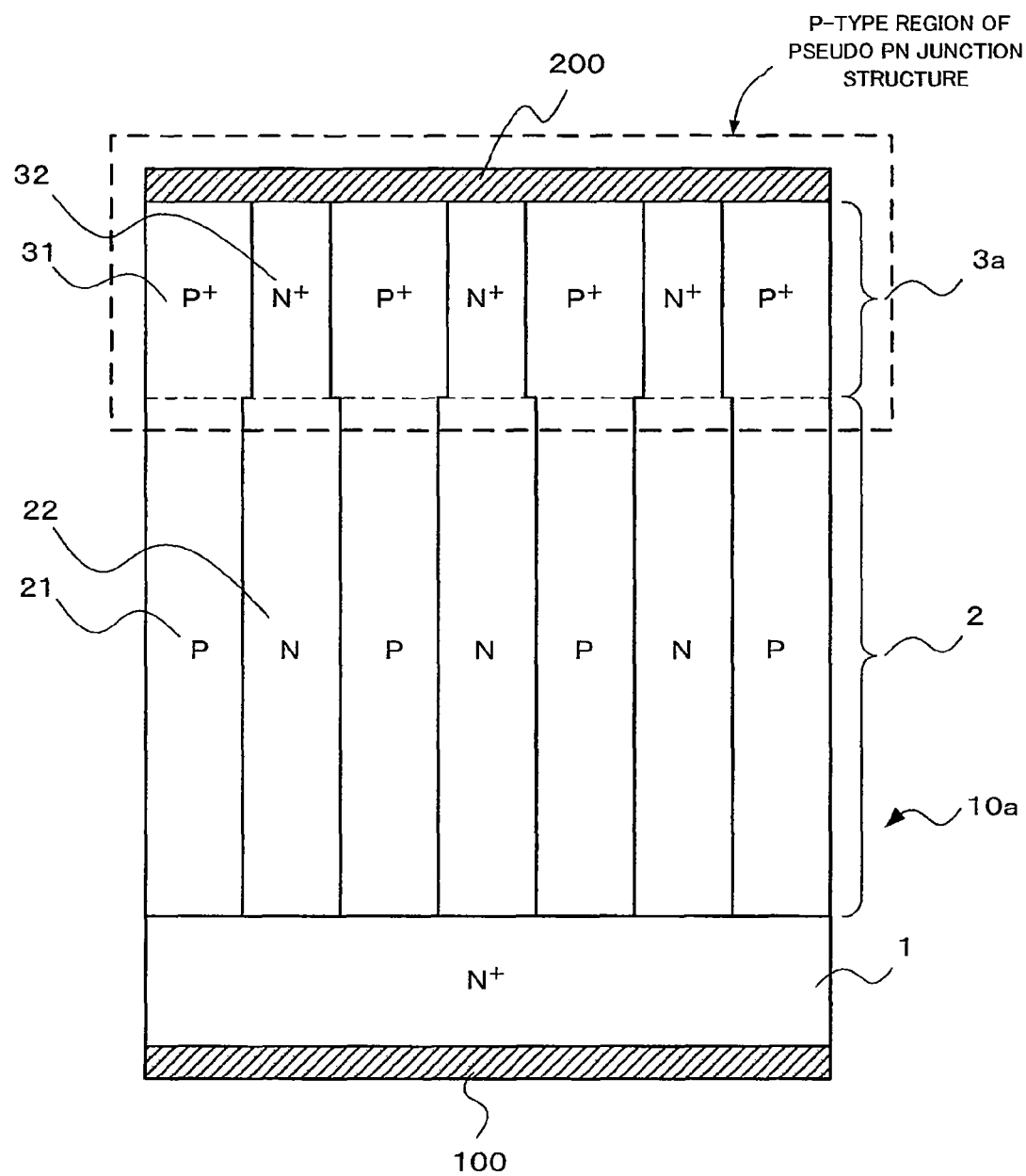
FIG. 12 is a view for explaining a concept of a structure of the semiconductor device according to the second embodiment.

In the second embodiment, similarly to the pseudo PN structure of the semiconductor device of the first embodiment, a region surrounded by a dotted line in FIG. 12 corresponding to FIG. 11 can be regarded as a pseudo PN junction structure conceptually. An operation of the pseudo PN junction structure portion will be described below.

As described above, in the semiconductor device of the second embodiment, the N$^+$ cathode layer 1, the N-type layers 22 having the low impurity concentration and the N$^+$ layers 32 having the high impurity concentration are continuously formed between the cathode electrode 100 and the anode electrode 200.

Accordingly, when a forward bias is applied between the cathode electrode 100 and the anode electrode 200, electrons of the N-type layers 1, 22 and 32 move from the cathode electrode 100 onto the side of the anode electrode 200, and a current flows from the anode electrode 200 toward the cathode electrode 100.

Figure 13:
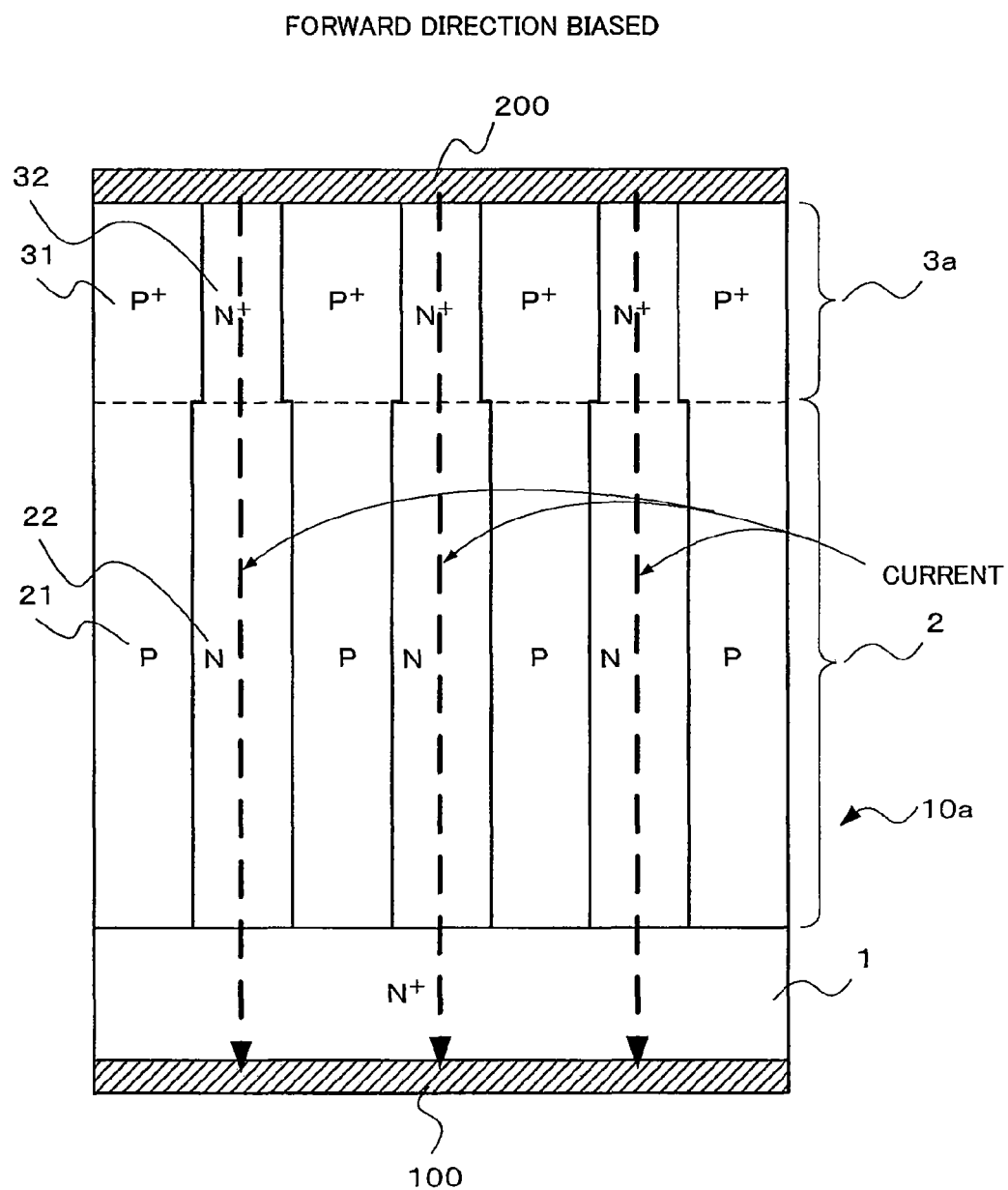
FIG. 13 is a view for explaining an operation of the semiconductor device according to the second embodiment when a forward bias is applied.

FIG. 13 is a view illustrating a state of a current flowing through the semiconductor device shown in FIG. 11 when the forward bias is applied.

As illustrated in FIG. 13, in the semiconductor device, current flows through the N-type layers 1, 22 and 32 formed between the cathode electrode 100 and the anode electrode 200 when the forward bias is applied. Therefore, unlike a conventional PiN-type diode, the semiconductor device can be designed such that any threshold caused by a built-in potential of a PN junction does not exist, or such that the threshold is decreased effectively. As a result, in the semiconductor device, the forward current flows even if the forward voltage is extremely low.

Figure 14:
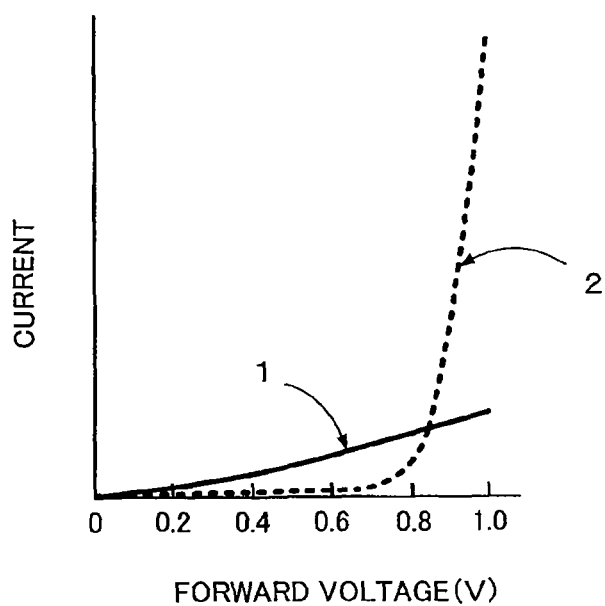
FIG. 14 is a view illustrating a simulation result as to a forward voltage-current characteristic of the semiconductor device according to the second embodiment.

In FIG. 14, the solid line 1 shows an example of a forward voltage-current characteristic of the semiconductor device of the second embodiment. In FIG. 14, the dotted line 2 shows a forward voltage-current characteristic of a conventional PiN-type diode.

In FIG. 14, according to the conventional PiN-type diode, a forward current flows when the forward voltage becomes about 0.8 V or more as shown by the curved line 2. On the other hand, according to the semiconductor device of the second embodiment, a forward current flows even if the forward voltage is 0.8 V or less as shown by the solid line 1.

Figure 15A:
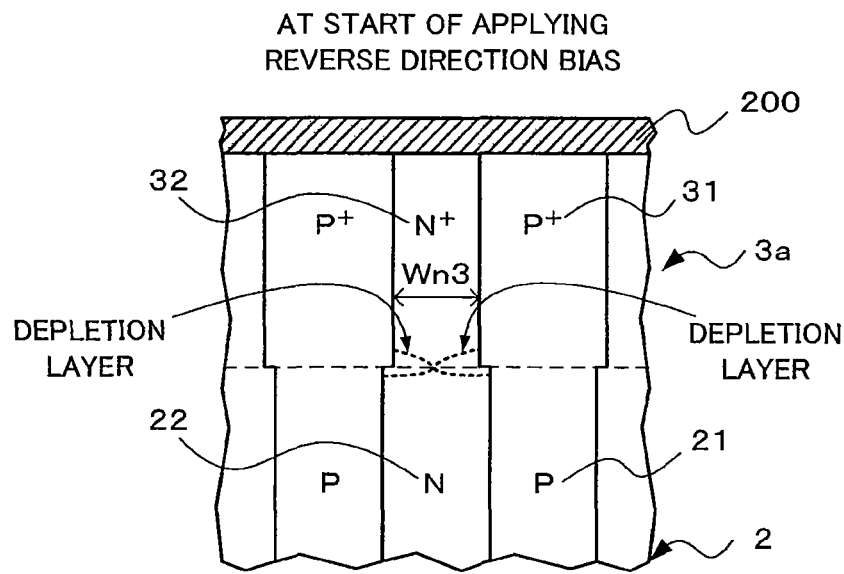
FIGS. 15A and 15B are views illustrating a state of the semiconductor device according to the second embodiment when application of a reverse bias is started.

FIG. 15A illustrates a state of a portion of the semiconductor device of the second embodiment at the beginning of applying a reverse bias. As illustrated in FIG. 15A, when the reverse bias is applied between the cathode electrode 100 and the anode electrode 200, depletion layers extend toward the N⁺ layers 32 of the anode layers 3a near boundaries with the N-type layers 22 from the P⁺ layers 31 adjacent to the N⁺ layers 32, at the beginning of applying the reverse bias. Because the width Wn3 of the N⁺ layers 32 are extremely narrow, the depletion layers extending from the P⁺ layers 31 adjacent to the N⁺ layers 32 come into contact with each other. As a result, the semiconductor device is pinched off near the boundaries between the N⁺ layers 32 of the anode layer 3a and the N-type layers 22.

Figure 15B:
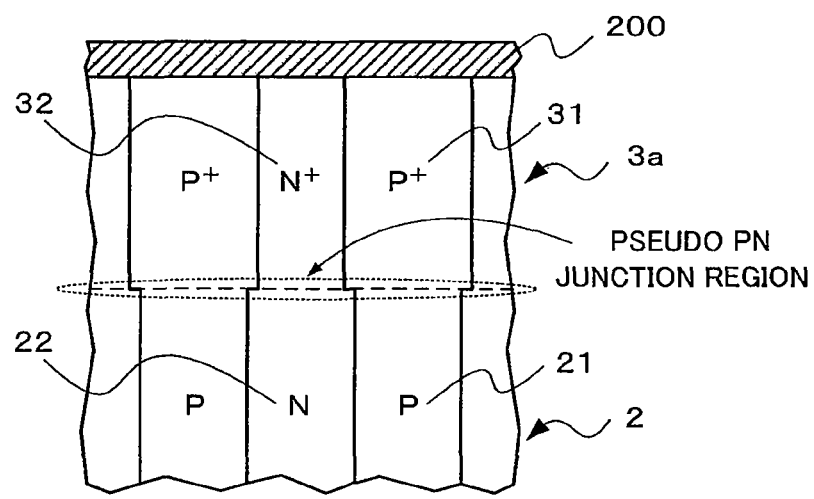

A pinch-off is usually generated in a junction plane of the PN junction. However, as described above, the pinch-off is generated near the boundaries between the N⁺ layers 32 and the N-type layers 22 in the second embodiment. From the viewpoint of similarity to generation of the pinch-off in the first embodiment of FIG. 1, as illustrated in FIG. 15B, the boundaries between the N⁺ layers 32 and the N-type layers 22 may be regarded as a pseudo PN junction region.

Figure 16:
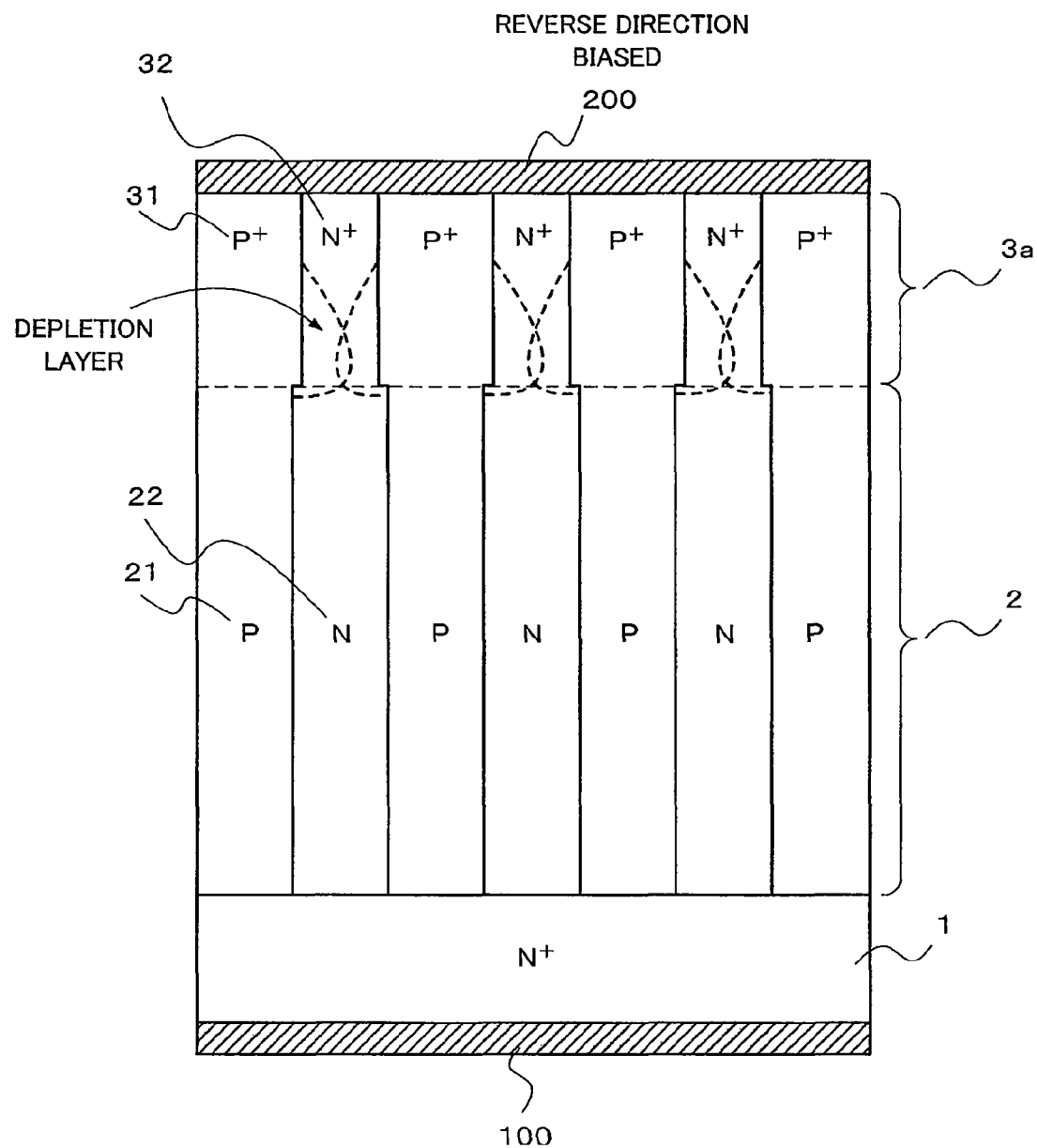
FIG. 16 is a view illustrating a state of the semiconductor device according to the second embodiment when the reverse bias is applied.

FIG. 16 is a view illustrating a state of the semiconductor device of the second embodiment when the reverse bias voltage is further increased. As illustrated in FIG. 16, when the reverse bias voltage is increased, depletion layers are formed near the centers of the N⁺ layers 32, and the pinch-off regions are enlarged.

The N⁺ layers 32 are pinched off by applying the reverse bias so that any current does not flow through the semiconductor device. When the rated reverse bias voltage of the semiconductor device is applied, the N-type layers 22 are also pinched off in addition to the N⁺ layers 32, similarly to a conventional multi RESURF element such as a super junction element.

Figure 17:
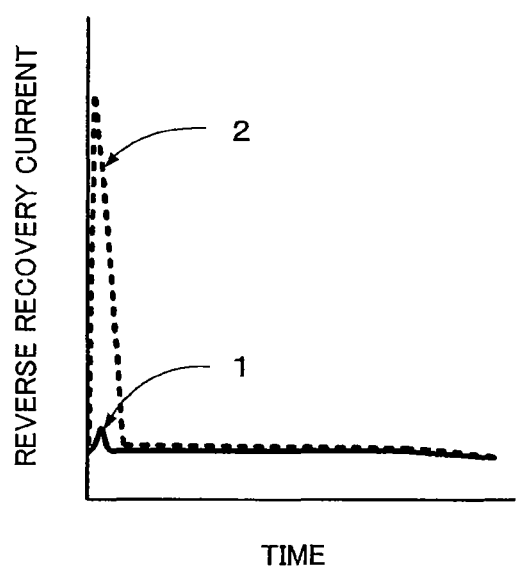
FIG. 17 is a view illustrating a simulation result as to a reverse recovery current characteristic of the semiconductor device according to the second embodiment.

FIG. 17 is a view illustrating an example of a reverse recovery current characteristic of the semiconductor device of the second embodiment. In FIG. 17, the solid line 1 shows a reverse recovery current characteristic of the semiconductor device of the second embodiment, and the line 2 shows a reverse recovery current characteristic of a conventional PiN diode.

The reverse recovery current of the semiconductor device is much smaller than the reverse recovery current of the conventional PiN diode.

As illustrated in FIG. 15B, in the semiconductor device of the second embodiment, a extremely narrow pseudo PN junction region is formed at a boundary between each N⁺ layer 32 of the anode layer 3a and each N-type layer 22 of the drift layer 2. Therefore, an extremely small number of holes are injected from the anode layer 3a into the drift layer 2, and the reverse recovery current becomes extremely small.

It can be expressed that the low injection efficiency of the anode layer 3a is achieved by an effective impurity concentration difference between the anode layer 3a and the drift layer 2.

Since the drift layer 2 is formed by a RESURF structure and the N-type layers 22 of the drift layer 2 has the low impurity concentration, the injection efficiency of holes injected from the P⁺ layers 31 of the anode layer 3a into the N-type layers 22 of the drift layer 2 is low, which causes decrease of the reverse recovery current.

Assuming that $N_A$ is an impurity concentration of the P⁺ layers 31 of the anode layer 3a and $N_D$ is an impurity concentration of the N-type layers 2 of the drift layer 2, injection efficiency γp of holes injected from the P⁺ layers 31 into the N-type layers 22 is expressed as follows using a coefficient A.

$$\gamma P = (1 + A \cdot N_D/N_A)^{-1}$$

As seen from the equation, the injection efficiency γp of the holes injected from the P⁺ layers 31 into the N-type layer 22 is decreased with increase of the impurity concentration $N_D$ of the N-type layers 22 of the drift layer 2. As a result, the number of holes injected from the P⁺ layers 31 into the N-type layers 22 is decreased so that the reverse recovery current is decrease.

Similarly, the injection efficiency γp can be expressed as follows using a hole current Jp and an electron current Jn, which flow between the anode layer 3a and the drift layer 2.

$$\gamma p = Jp/(Jp+Jn)$$

The injection efficiency γp of holes injected from the P⁺ layers 31 into the N-type layers 22 can be decreased by designing a ratio of the hole current Jp to a whole current (Jp+Jn) to set to a lower level. Therefore, the number of holes injected from the P⁺ layers 31 into the N-type layers 22 is decreased, which allows the reverse recovery current to be decreased.

When the reverse recovery current is decreased, the power loss is reduced during the transition to a reverse bias state, and the withstand voltage of the semiconductor device can be improved.

According to the second embodiment, current flows through the N-type layers 1, 22, and 32 which are formed between the cathode electrode 100 and the anode electrode 200 when a forward bias is applied. A forward current can flow even if the forward voltage is lower than a threshold caused by a built-in potential of a PN junction. According to the second embodiment, the current can flow in a voltage range lower than a threshold of a conventional PiN-type diode without providing a Schottky electrode.

According to the second embodiment, since the reverse recovery current can be decreased, the power loss can be reduced in the transition from the forward bias state to the reverse bias state, and therefore, the withstand voltage of the semiconductor device can be improved.

According to the second embodiment, the anode layer 3a and the drift layer having the multi RESURF structure are combined. The anode layer 3a is formed such that the wide P⁺ layers 31 and the narrow N⁺ layers 32 are alternately arranged. As a result, a low forward threshold and a good reverse recovery characteristic can be realized while a high reverse-direction blocking characteristic similar to that of the conventional PiN diode is maintained.

In the second embodiment, when the injection efficiency γP is set to γP<0.8 to 0.5, the reverse recovery current is advantageously decreased. Desirably, γP<0.3 is satisfied in order to decrease the reverse recovery current sufficiently.

Figure 18:
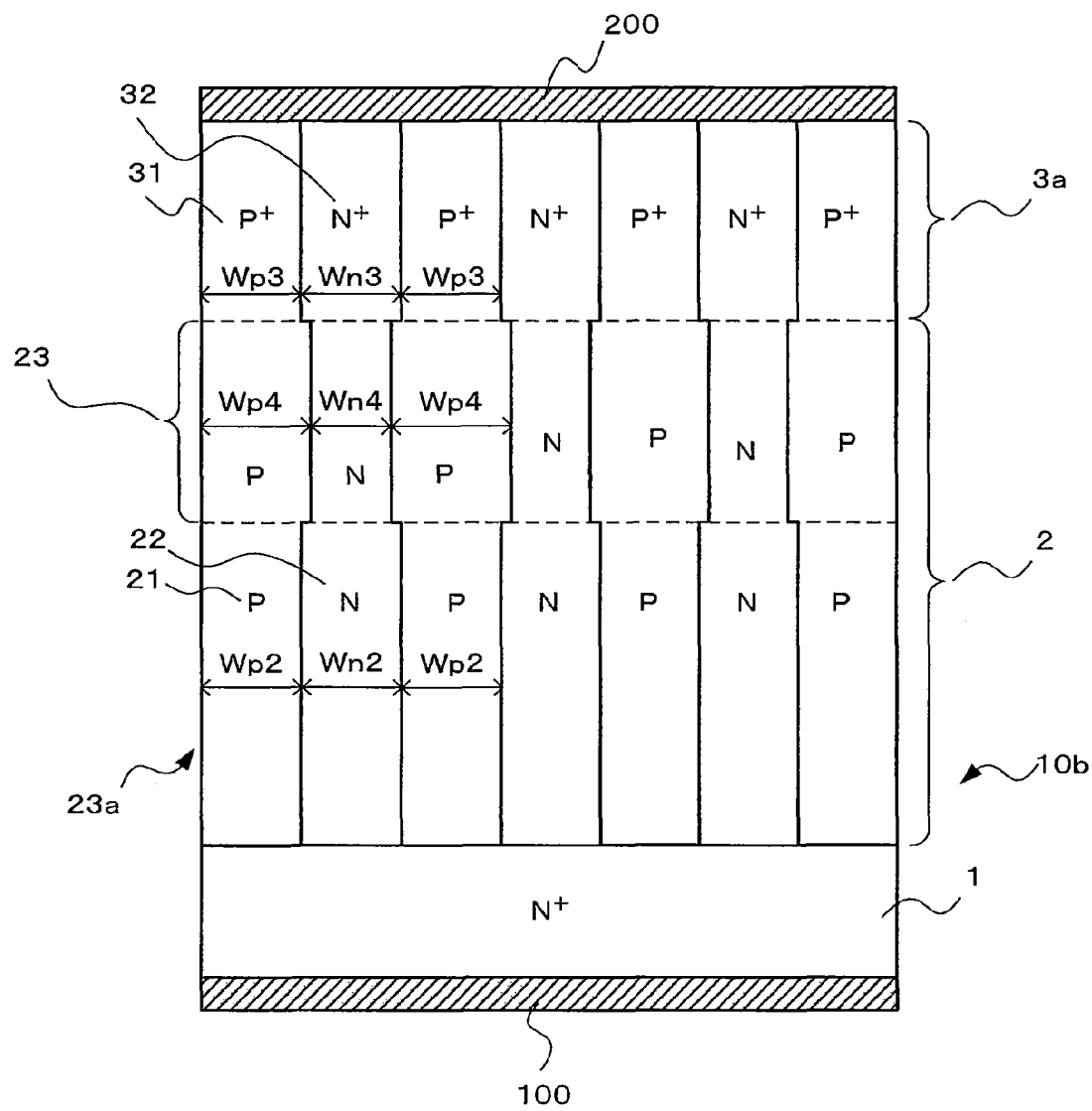
FIG. 18 is a sectional view schematically illustrating a configuration of a semiconductor device according to a third embodiment.

A third embodiment of the invention will be described with reference to FIG. 18. FIG. 18 is a schematic sectional view illustrating a configuration of a semiconductor device according to the third embodiment.

FIG. 18 illustrates a vertical section of the semiconductor substrate 10b. The semiconductor device of the third embodiment is provided with a cathode electrode 100, an N⁺-type cathode layer 1, a drift layer 2, an anode layer 3a, and an anode electrode 200. The drift layer 2 is formed such that P-type layers 21 and N-type layers 22, which have an equal impurity concentration substantially, are alternately arranged. The anode layer 3a is formed such that P⁺ layers 31 and N⁺ layers 32, which have an equal impurity concentration substantially, are alternately arranged.

In the second embodiment of FIG. 11, the $N^+$ layers 32 of the anode layer 3a are narrower than the $P^+$ layers 31. On the other hand, in the third embodiment, as illustrated in FIG. 18, the $N^+$ layers 32 of the anode layer 3a and the $P^+$ layer 31s are formed such that the width Wn3 of the $N^+$ layer 32 of the anode layers 3a is substantially equal to the width Wp3 of the $P^+$ layers 31. Additionally, the width Wn4 of portions of the N-type layers 22 located in an upper region 23 of the drift layer, which is in contact with the anode layer 3a, is smaller than the width Wp4 of portions of the P-type layers 21 located in the region 23.

A region 23a below the region 23 of the drift layer 2 is formed such that the width Wn2 of portions of the N-type layers 22 are substantially equal to the width Wp2 of portions of the P-type layers 21.

The width Wn4 of the portions of the N-type layers 22 located in the region 23 is smaller than the width Wn3 of the $N^+$ layers 32 of the anode layer 3a and the width Wn2 of the portions of the N-type layers 22 located in the region 23a below the region 23 of the drift layer 2.

The width Wn4 of the portions of the N-type layers 22 located in the region 23 is formed as extremely small as 0.1 to 0.2 μm.

According to the structure of the third embodiment, when the reverse bias is applied, pinch-off is caused in the portion of the N-type layers 22 located in the region 23 by depletion layers extending from the P-type layers 21 located on both sides of the portions of the N-type layers 22.

When the forward bias is applied, since the $P^+$ layers 31 and $N^+$ layers 32 of the anode layer 3a are set to the same potential by the anode electrode 20, current is produced mainly based on electrons flowing in the N-type layers 22 and 32 between the anode electrode 200 and the cathode electrode 100, and holes are rarely injected from the $P^+$ layers 31 of the anode layer 3a to the N-type layers 22 of the drift layer 2.

Holes, which are injected into the portion of the N-type layers 22 located in the region 23 through the portion of the P-type layers 21 located in the region 23, and holes, which are injected from the P-type layers 21 of the drift layer 2 into the $N^+$ cathode layer 1, exist partially when a forward bias of 0.5 V or more is applied so as to exceed the built-in voltage. However, a short circuit is formed between the anode electrode 200 and the cathode electrode 100 by the $N^+$ layers 32 of the anode layer 3a and the N-type layers 22 of the drift layer 2. Accordingly, excess carriers are not accumulated in the N-type layers 22 of the drift layer 2 when the forward bias is applied. As a result, the reverse recovery current does not flow even if a transition is performed from the forward bias state to the reverse bias state.

According to the third embodiment, the narrow portions of the N-type layers 22 are formed in the region 23 of the drift layer 2 near the boundaries with the anode layer 3a so that generation of reverse recovery current is suppressed and the withstand voltage of the semiconductor device is further improved.

The $N^+$ layers 32 of the anode layer 3a are formed to be as extremely narrow as about 0.1 to about 0.2 μm in the second embodiment, and the portions of the N-type layers 22 of the drift layer 2 located in the region 23 are formed to be as extremely narrow as about 0.1 to about 0.2 μm in the third embodiment. Since the $N^+$ layers 32 or the portions of the N-type layers 22 of the drift layer 2 in the region 23 are narrowed, a pinch-off state is generated when a reverse bias is applied, and the withstand voltage of the semiconductor device is enhanced.

The width of the $N^+$ layers 32 or the portions of the N-type layers 22 in the region 23 is set in the range of about 0.1 to about 0.2 in μm, which causes difficulty in manufacturing. From the manufacturing viewpoint, the width of the $N^+$ layers 32 or the portion of the N-type layers 22 is formed to be large desirably. However, when the width of the $N^+$ layers 32 or the portion of the N-type layers 22 is large, the interval between the depletion layers extending from both side surfaces of the N-type layers 32, 22 is widened during applying the reverse bias so that the pinch-off state is difficult to be generated, and leakage current increases to lower the withstand voltage of the semiconductor device.

Figure 19:
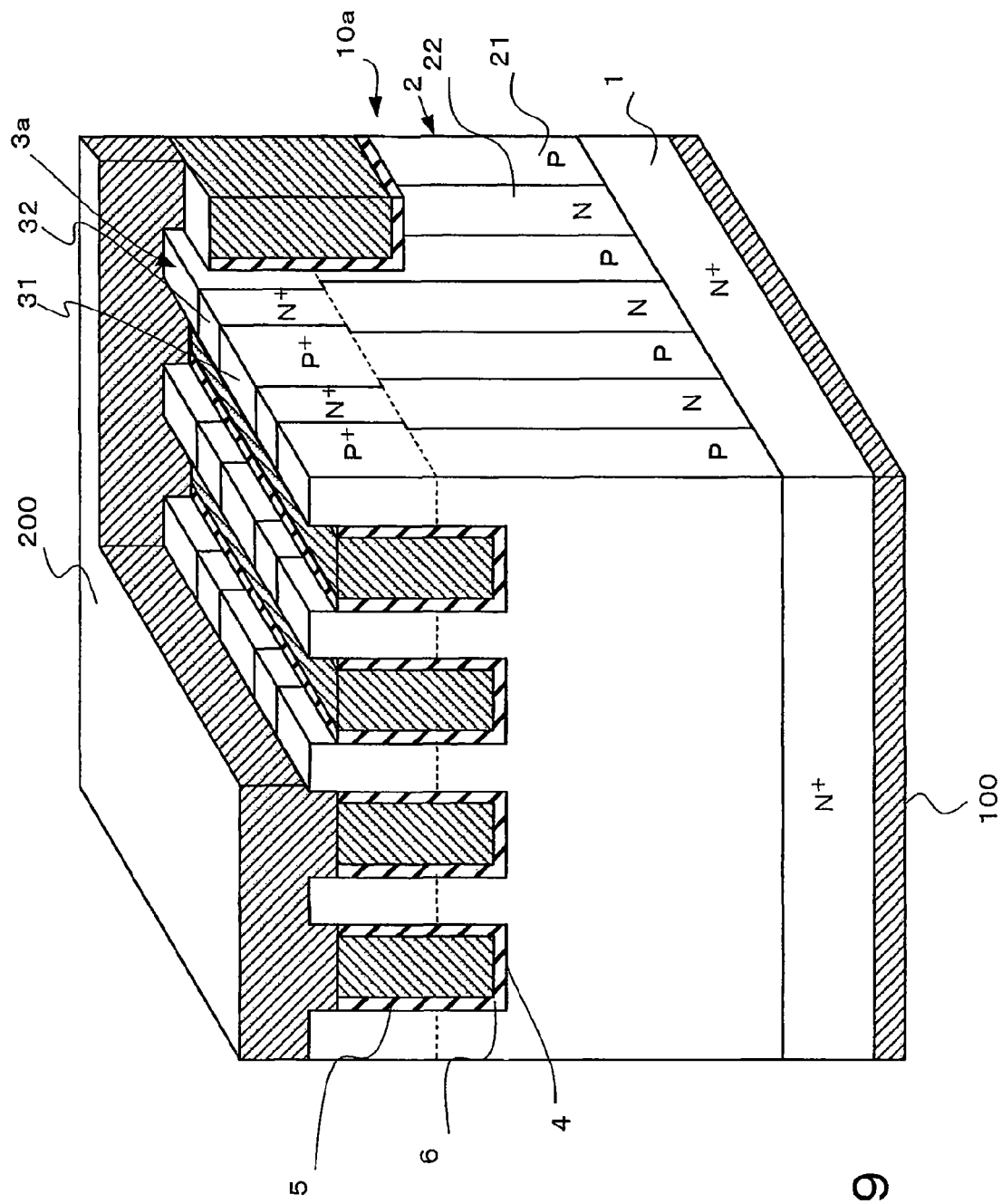
FIG. 19 is a perspective view schematically illustrating a configuration of a semiconductor device according to a fourth embodiment.

FIG. 19 shows a semiconductor device of a fourth embodiment where a pinch-off state can be generated during applying a reverse bias to enhance the withstand voltage even if the width of the $N^+$ layers 32 or the portions of the N-type layers 22 is enlarged.

FIG. 19 is a perspective view schematically illustrating the configuration of the semiconductor device according to the fourth embodiment. FIG. 19 partially illustrates a section of the semiconductor device. The semiconductor device of the fourth embodiment has a structure that trenches 4 are formed in the anode layer 3a and the drift layer 2 provided in the second embodiment shown in FIG. 11.

A buried electrode 5 is formed in each of the trenches 4. An insulating film 6 such as an oxide film is interposed between each buried electrode 5 and each of the trenches 4. An upper surface of each buried electrode 5 is in contact with an anode electrode 200 so that the buried electrodes 5 are electrically connected to the anode electrode 200.

In the fourth embodiment, the width of the $N^+$ layers 32 of the anode layer 3a is smaller than that of the $P^+$ layers 31 of the anode layer 3a and larger than that of the $N^+$ layers 32, respectively shown in the second embodiment.

In the fourth embodiment, each buried electrode 5 is connected to the anode electrode 200. When a reverse bias voltage is applied to the anode electrode 200, P-type inversion layers are formed in side surface portions of the $N^+$ layers 32 of the anode layer 3a adjacent to the insulating films 6.

Accordingly, in the $N^+$ layers 32 of the anode layer 3a, depletion layers extend not only from the $P^+$ layers 31 adjacent to the $N^+$ layers 32 but also from the P-type inversion layers formed in the side face portions, during applying a reverse bias. Therefore, a pinch-off state can be generated even if the width of the $N^+$ layers 32 is large.

Similarly, a pinch-off state can be generated even if each buried electrode 5 is provided in the semiconductor device of the third embodiment illustrated in FIG. 18 and the portions of the N-type layers 22 located in the region 23 are widen.

According to the fourth embodiment, the $N^+$ layers 32 of the anode layer 3a or the N-type layers 22 of the drift layer 2 can be widened in order to generate a pinch-off state and to improve the withstand voltage.

In the fourth embodiment, the buried electrodes 5 are in contact with the anode electrode 200 and are electrically connected to the anode electrode 200. On the other hand, in the fifth embodiment illustrated in FIG. 20, some of buried electrodes 5 are in contact with gate electrodes 300 other than the anode electrodes 200 and are electrically connected to the gate electrodes 300.

Figure 20:
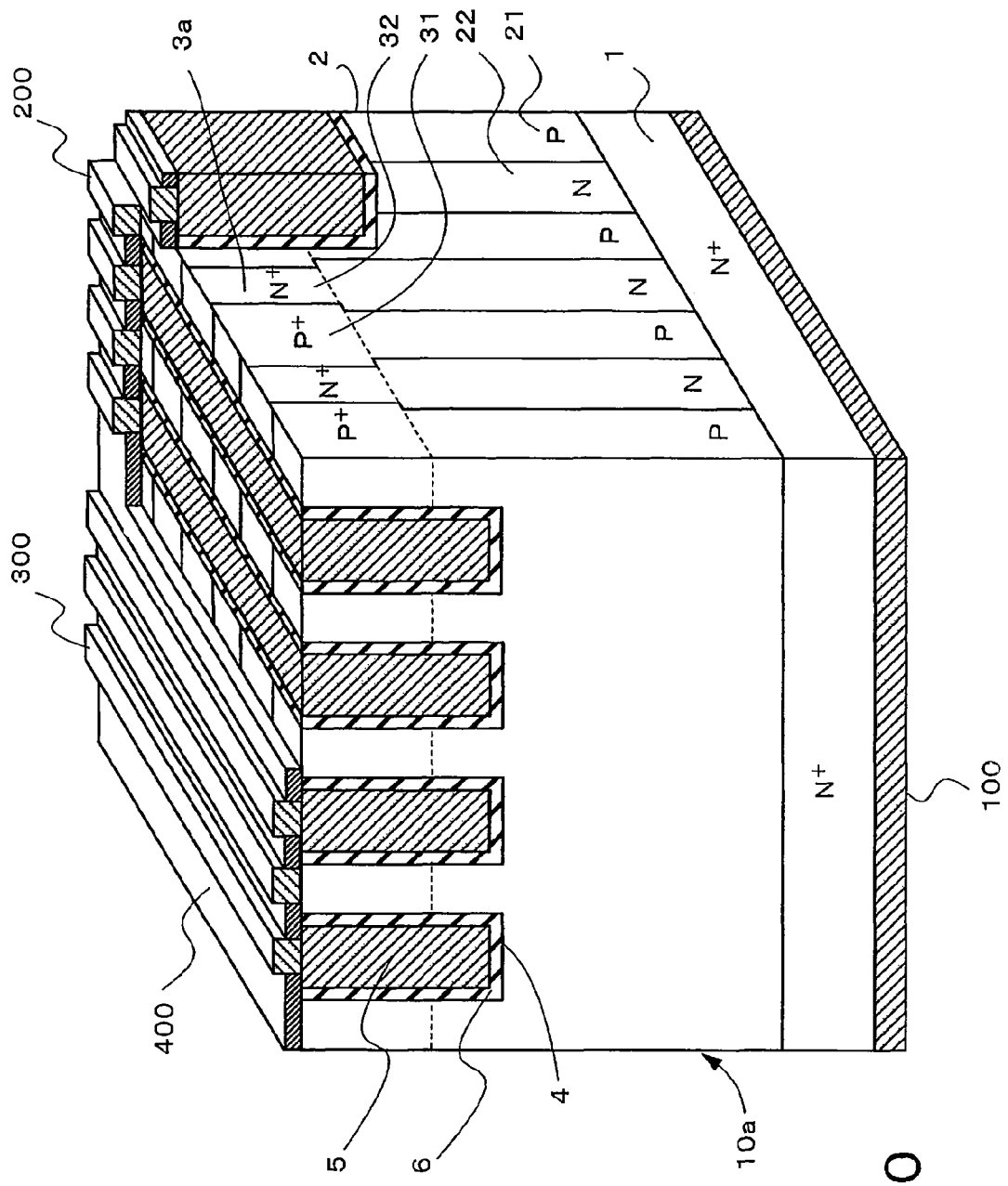
FIG. 20 is a perspective view schematically illustrating a configuration of a semiconductor device according to a fifth embodiment.

A fifth embodiment of the invention will be described with reference to FIG. 20. FIG. 20 is a perspective view schematically illustrating a configuration of a semiconductor device according to the fifth embodiment. FIG. 20 partially illustrates a section of the semiconductor device.

Similarly to the fourth embodiment, the semiconductor device of the fifth embodiment has a structure that trenches 4 are formed in an anode layer 3a and a drift layer 2. Buried electrodes 5 are formed in the trenches 4 respectively. Insulating films 6 are interposed between the buried electrodes 5 and the trenches 4 respectively. The anode electrodes 200 and the gate electrodes 300 are alternately arranged. The anode electrode 200 and the gate electrode 300 are insulated by an interlayer insulating films 400. Some of the buried electrodes 5 are in contact with the gate electrode 200, and is electrically connected to the gate electrodes 200.

In the fifth embodiment, when a forward bias is applied, the width of depletion layers formed in $N^+$ layers 32 of the anode layer 3a or N-type layers 22 of the drift layer 2 are controlled by regulating a voltage to be applied to the gate electrodes 300, and current flowing between the anode electrodes 200 and the cathode electrode 100 can be controlled.

Figure 21:
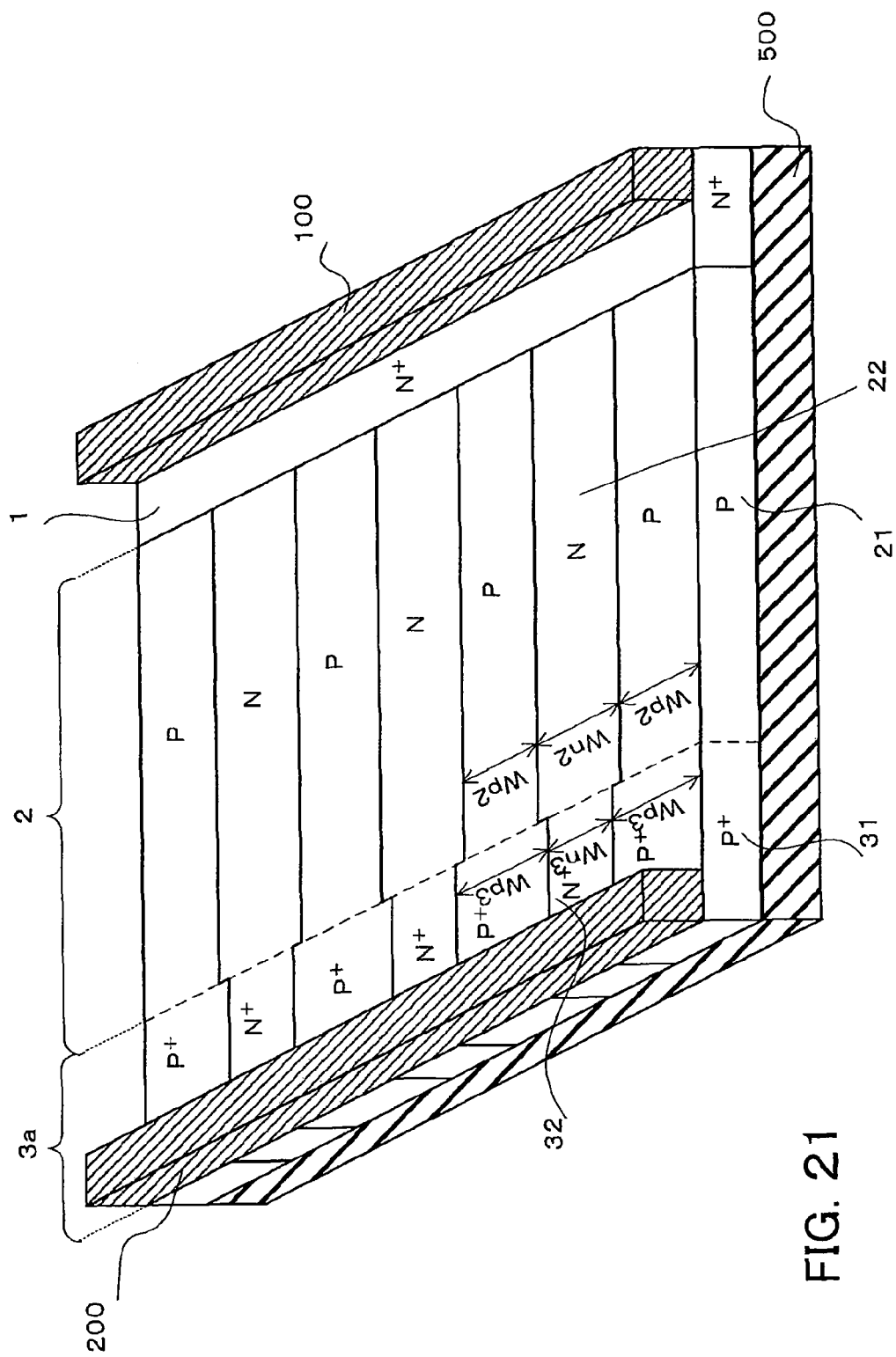
FIG. 21 is a perspective view schematically illustrating a configuration of a semiconductor device according to a sixth embodiment.

In the above embodiments, the semiconductor devices are examples of vertical elements. In the vertical elements, the cathode layer 1, the drift layer 2 and the anode layer 3a are vertically formed in order. FIG. 21 illustrates an example of a lateral element as a sixth embodiment where a cathode layer 1, a drift layer 2 and an anode layer 3a are laterally formed in order.

FIG. 21 is a perspective view schematically illustrating a configuration of a semiconductor device according to the sixth embodiment. FIG. 21 partially illustrates a section of the semiconductor device. The sixth embodiment has a lateral element structure corresponding to the vertical element structure of the second embodiment.

The $N^+$-type cathode layer 1, the drift layer 2 adjacent to the cathode layer 1, and the anode layer 3a adjacent to the drift layer 2 are formed into a planar shape on an insulating layer 500. A cathode electrode 100 is formed on the cathode layer 1 so as to be in contact with the cathode layer 1. An anode electrode 200 is formed on the anode layer 3a so as to be in contact with the anode layer 3a.

The drift layer 2 is formed such that P-type layers 21 having low impurity concentrations and N-type layers 22 having low impurity concentrations are alternately arranged. The anode layer 3a is formed such that $P^+$ layers 31 having high impurity concentrations and $N^+$ layers 32 having high impurity concentrations are alternately arranged.

Similarly to the second embodiment, the P-type layers 21 and N-type layers 22 of the drift layer 2 have the same impurity concentration substantially, and the P-type layers 21 and the N-type layers 22 are formed such that widths Wp2, Wn2 in the arrangement directions of the P-type layers 21 and N-type layers 22 are equal to each other.

The $P^+$ layers 31 and $N^+$ layers 32 of the anode layer 3a have the same impurity concentration substantially, and the $P^+$ layers 31 and the $N^+$ layers 32 are formed such that widths Wp3, Wn3 in the arrangement directions of the $P^+$ layers 31 and $N^+$ layers 32 are equal to each other. The width Wn3 of the $N^+$ layers 32 is formed to be as extremely small as 0.1 to 0.2 µm. The width Wp3 of the $P^+$ layers 31 is larger than the width Wn3 of the $N^+$ layers 32 by about 10 to about 20%.

Since the sixth embodiment has the layer structure similarly to the second embodiment, electric characteristics of the sixth embodiment are similar to those of the second embodiment. Accordingly, similarly to the second embodiment, the current can flow in the voltage range lower than a threshold of a conventional PiN-type diode. Since the reverse recovery current can be decreased, the power loss can be reduced during transition from a forward bias state to a reverse bias state, and the withstand voltage of the semiconductor device can be improved.

According to the sixth embodiment, the cathode layer 1, the drift layer 2, and the anode layer 3a are formed on the insulating layer 500 so that the semiconductor device can easily be manufactured compared with a vertical structure.

Figure 22:
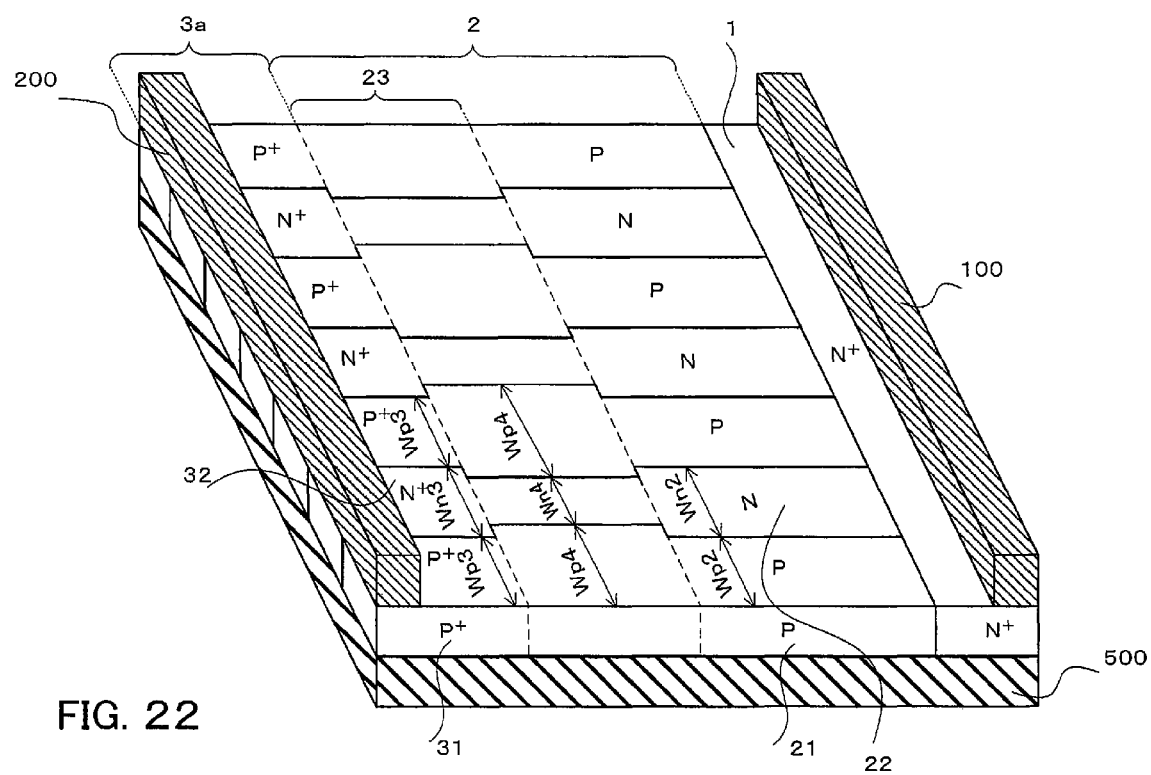
FIG. 22 is a perspective view schematically illustrating a configuration of a semiconductor device according to a seventh embodiment.

A seventh embodiment will be described with reference to FIG. 22. FIG. 22 is a perspective view schematically illustrating a configuration of a semiconductor device according to the seventh embodiment. FIG. 22 partially illustrates a section of the semiconductor device.

The semiconductor device of the seventh embodiment has a lateral element structure corresponding to the vertical element structure of the third embodiment. In the seventh embodiment, similarly to the third embodiment, $N^+$ layers 32 and $P^+$ layers 31 of an anode layer 3a are formed such that a width Wn3 of the $N^+$ layers 32 is equal to a width Wp3 of the $P^+$ layers 31. In a region 23 of a drift layer 2 on the boundary side of the anode layer 3a, a width Wn4 of portions of N-type layers 22 is smaller than a width Wp4 of portions of P-type layers 21. In a region except the region 23 of the drift layer 2, a width Wn2 of portions of the N-type layers 22 is equal to a width Wp2 of portions of the P-type layers 21.

In the seventh embodiment, similarly to the third embodiment of FIG. 18, when the width Wn4 of the portions of the N-type layers 22 located in the region 23 on the side of the anode layer 3a is formed to be as extremely small as 0.1 to 0.2 µm, pinch-off is generated in the portions of the N-type layers 22 located in the region 23, by depletion layers extending from the P-type layers 21 on both sides of the N-type layers 22 during applying a reverse bias.

The $P^+$ layers 31 and $N^+$ layers 32 of the anode layer 3a are set to the same potential by an anode electrode 200. Accordingly, during applying the forward bias, current is produced mainly based on electrons flowing in the $N^+$ layers 32 and N-type layers 22 between the anode electrode 200 and a cathode electrode 100. Holes are not injected from the $P^+$ layers 31 of the anode layer 3a to the N-type layers 22 of the drift layer 2.

When a forward bias is applied so as to exceed a built-in voltage (0.5 V or more) of a PN junction of the semiconductor device, holes, which are injected into the portions of the N-type layers 22 located in the region 23 through the portions of the P-type layer 21 located in the region 23, and holes, which are injected from the P-type layer 21 of the drift layer 2 into the $N^+$ layer 32 of the cathode layer 1 exist partially. However, short circuit is caused between the anode electrode 200 and the cathode electrode 100 by the $N^+$ layers 32 of the anode layer 3a and the N-type layers 22 of the drift layer 2. Accordingly, since the excess carriers are not accumulated in the N-type layers 22 of the drift layer 2 during applying a forward bias, the reverse recovery current does not flow even if a transition from a forward bias state to a reverse bias state is performed.

The seventh embodiment decreases the width of the portions of the N-type layers 22 located in the region 23 of the drift layer 2 on the side of the boundaries with the anode layer 3a. As a result, generation of reverse recovery current can be suppressed so as to improve the withstand voltage of the semiconductor device formed into the lateral element structure further.

In the lateral elements of the sixth and seventh embodiments, the P-type layers 21 and N-type layers 22 of the drift layer 2 are alternately arranged on a plane, and the $P^+$ layers 31 and $N^+$ layers 32 of the anode layer 3a are alternately arranged on the plane. Thus, a chip area in the plane direction is enlarged. Accordingly, effective current density per unit area is decreased. In the eighth embodiment illustrated in FIG. 23, the effective current density per unit area can be increased.

Figure 23:
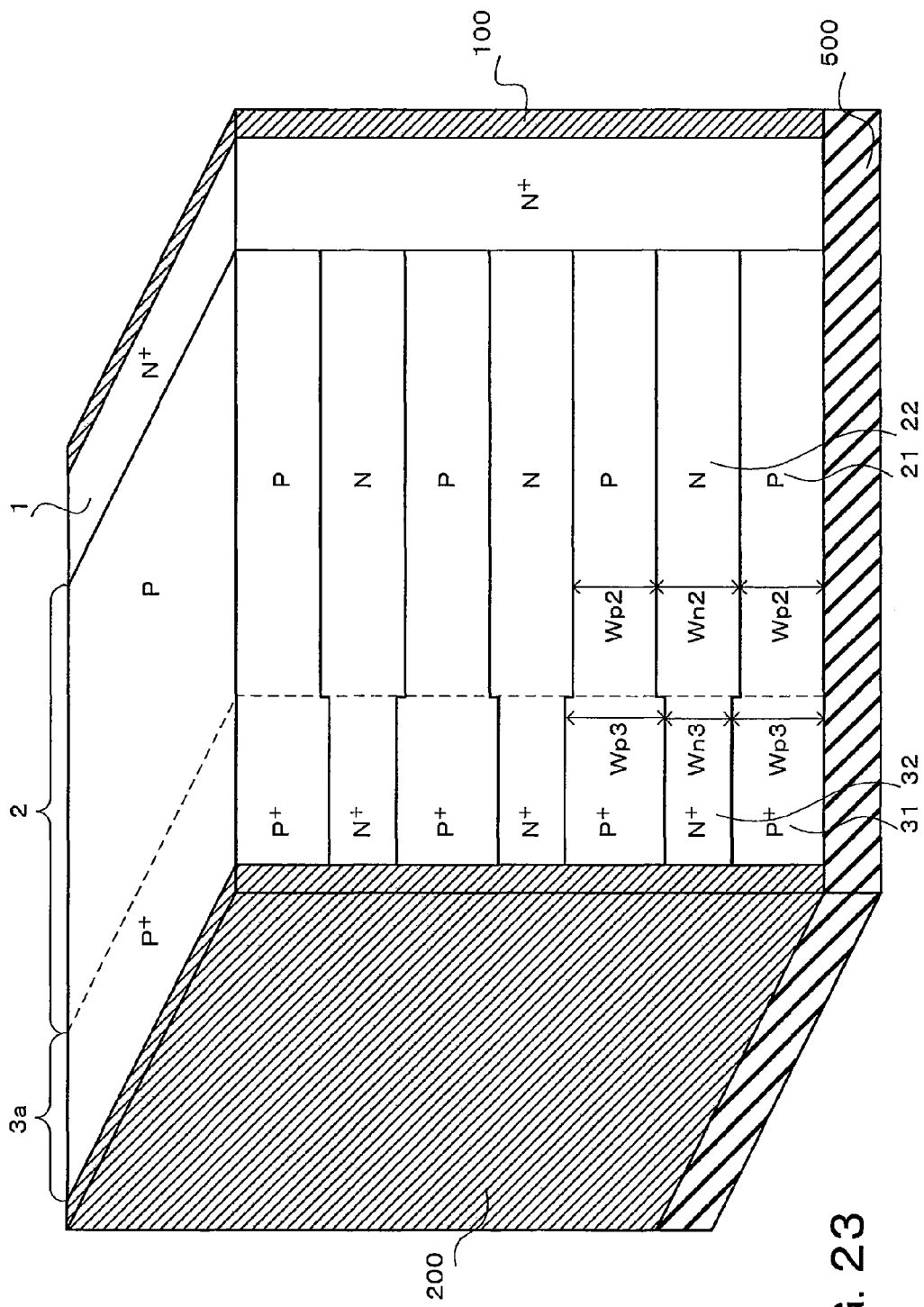
FIG. 23 is a perspective view schematically illustrating a configuration of a semiconductor device according to an eighth embodiment.

An eighth embodiment will be described with reference to FIG. 23. FIG. 23 is a perspective view schematically illustrating a configuration of a semiconductor device according to the eighth embodiment. FIG. 23 partially illustrates a section of the semiconductor device.

In the semiconductor device of the eighth embodiment, a cathode layer 1, a drift layer 2, and an anode layer 3a are formed on an insulating layer 500. The drift layer 2 is adjacent to the cathode layer 1, and the anode layer 3a is adjacent to the drift layer 2. In the drift layer 2, P-type layers 21 and N-type layers 22 having low impurity concentrations are alternately stacked. In the anode layer 3a, P+ layers 31 and N+ layers 32 high impurity concentration are alternately stacked. The height of the cathode layer 1 is set so as to be matched with the stacked heights of the drift layer 2 and anode layer 3a. A cathode electrode 100 is formed so as to be in contact with a side surface of the cathode layer 1. An anode electrode 200 is formed so as to be in contact with a side surface of the anode layer 3a.

In the eighth embodiment, the widths Wp2, Wn2 of the P-type layers 21 and N-type layers 22 of the drift layer 2 and the widths Wp3, Wn3 of the P+ layers 31 and N+ layers 32 of the anode layer 3a are arbitrarily set by determining the heights to be given respectively.

The width Wn2 of the P-type layers 21 of the drift layer 2 is equal to the width Wp2 of the N-type layers 22. The width Wn3 of the P+ layers 31 of the anode layer 3a is formed in a range of 0.1 to 0.2 The width Wp3 of the N+ layers 32 is larger than the width Wn3 by about 10 to about 20%. By such a configuration, electric characteristics similar to those of the sixth embodiment are obtained.

In the eighth embodiment, when a forward bias is applied between the cathode electrode 100 and the anode electrode 200, current flows through the N+ cathode layer 1 and an N-type semiconductor area including the N-type layers 22 and the N+ layers 32, which are continuously formed between the cathode electrode 100 and the anode electrode 200.

Figure 24:
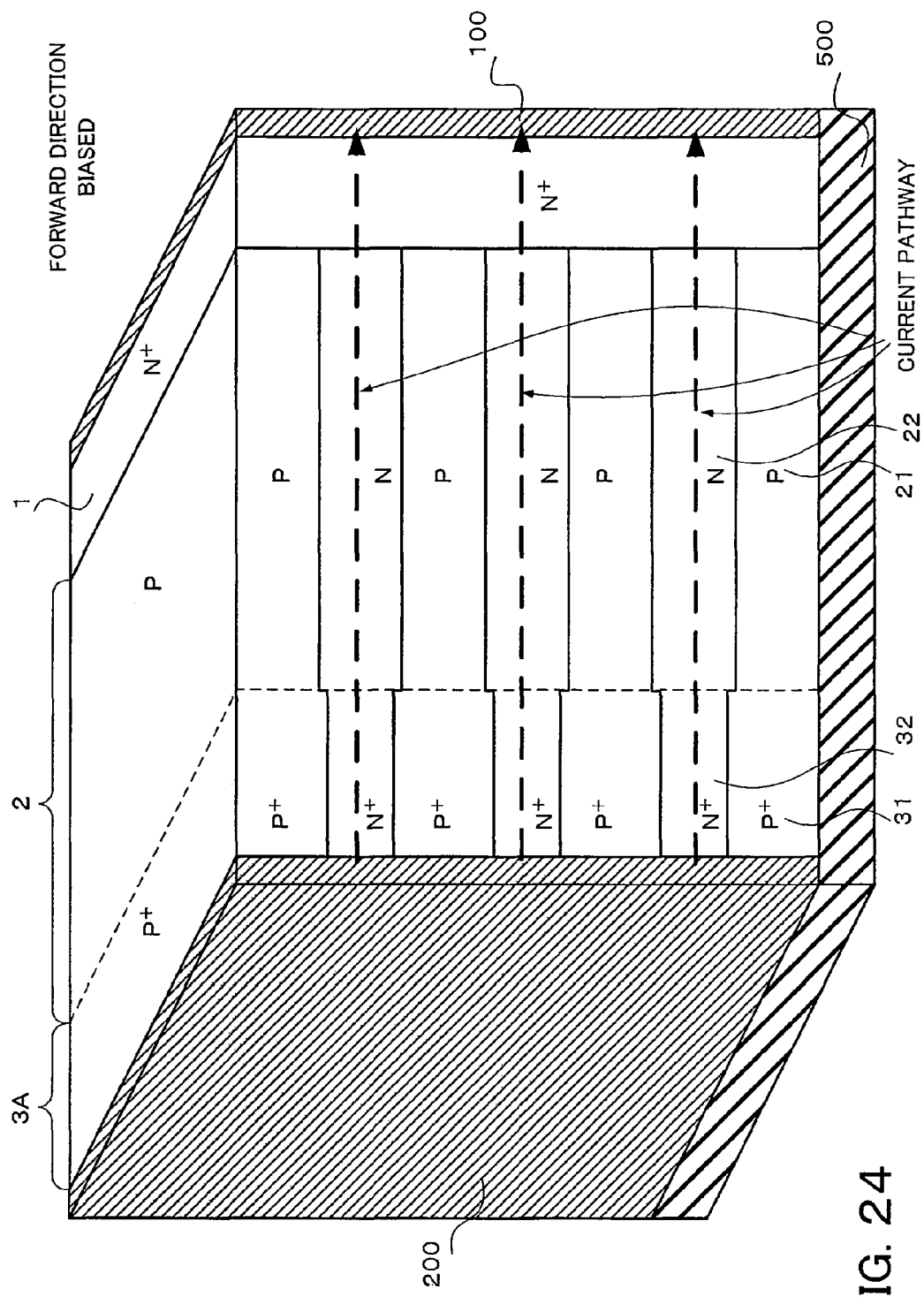
FIG. 24 is a view illustrating a current pathway of the semiconductor device according to the eighth embodiment when a forward bias is applied.

Since the eighth embodiment has a stacked structure, those plural N-type layers are laterally formed above the insulating layer 500. Accordingly, as illustrated in FIG. 24, when a forward bias is applied, plural current passages are laterally formed above the insulating layer 500 and between the cathode electrode 100 and the anode electrode 200.

According to the eighth embodiment, the plural current passages are formed to have a plane-shape respectively so that the effective current density per unit area can be increased.

Figure 25:
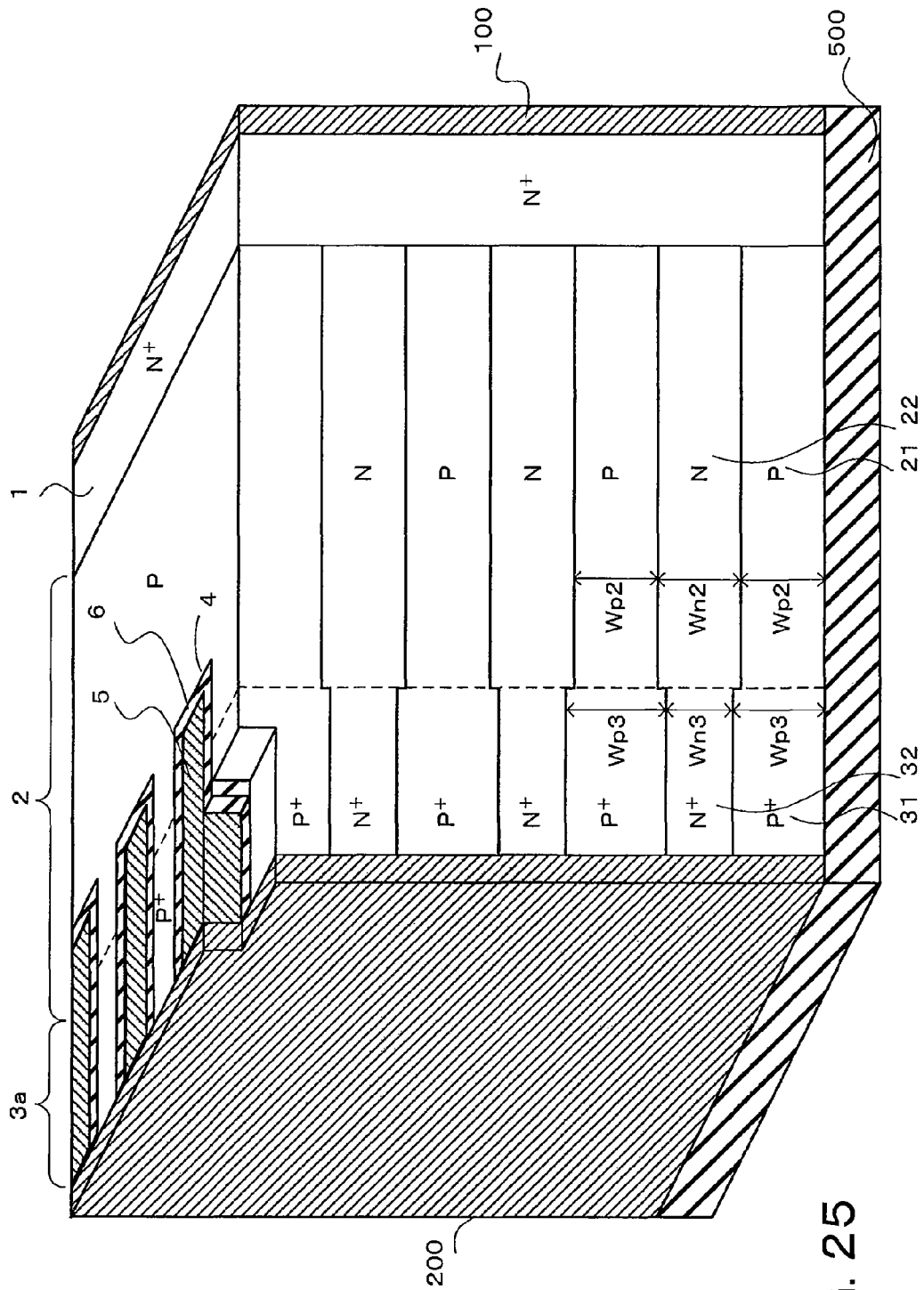
FIG. 25 is a perspective view schematically illustrating a configuration of a semiconductor device according to a ninth embodiment.

A ninth embodiment will be described with reference to FIG. 25. FIG. 25 is a perspective view schematically illustrating a configuration of a semiconductor device according to the ninth embodiment. FIG. 25 partially illustrates a section of the semiconductor device.

The semiconductor device has a structure obtained by combining the structure of the eighth embodiment shown in FIG. 23 and the structure of the fifth embodiment shown in FIG. 20. More specifically, similarly to the fifth embodiment of FIG. 20, buried electrodes 5 are respectively formed in trenches 4 which are provided at side surface portions of an anode layer 3a and a drift layer 2 shown in FIG. 23. Insulating films 6 are respectively interposed between the buried electrodes and the trenches. The buried electrodes 5 are connected to an anode electrode 200.

Pinch-off state can easily be generated by applying the same reverse bias voltage as that to be applied to the anode electrode 200, to the buried electrodes 5. Accordingly, N+ layers 32 of an anode layer 3a or N-type layers 22 of a drift layer 2 can be formed wider than those of the eighth embodiment, in order to generate the pinch-off state.

Figure 26:
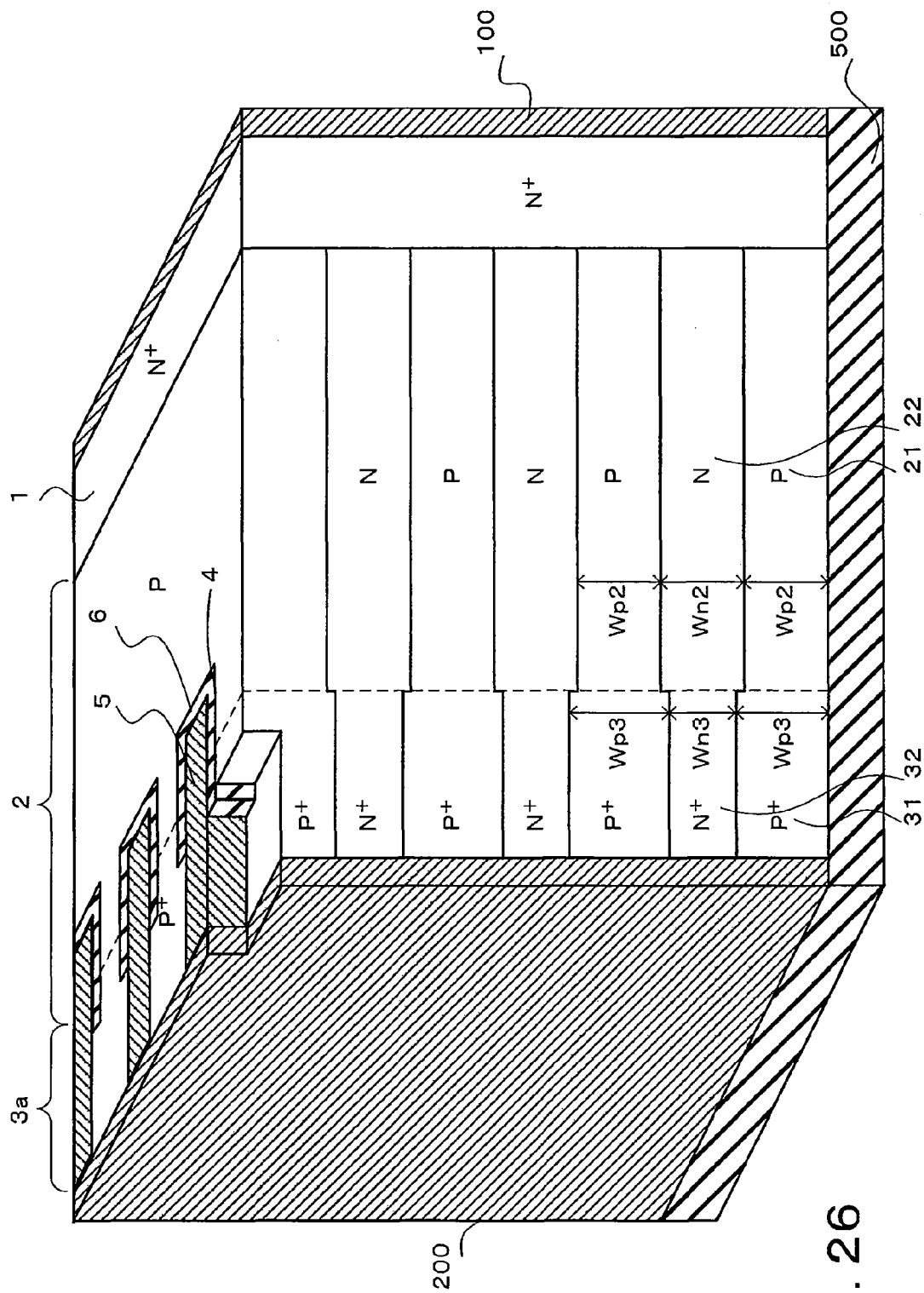
FIG. 26 is a perspective view schematically illustrating a configuration of a semiconductor device according to a modification of the ninth embodiment.

FIG. 26 is a perspective view schematically illustrating a configuration of a semiconductor device according to a modification of the ninth embodiment. FIG. 26 partially illustrates a section of the semiconductor device. The modification illustrated in FIG. 26 differs from the ninth embodiment illustrated in FIG. 25 in the positions of regions to form the insulating films 6. In the modification, the regions to form the insulating films 6 are formed at positions receding from end portions of the anode layer 3a on the side of the anode electrode 200.

Since the positions of the regions to form the insulating films 6 recedes from the end portions of the anode layer 3a, the area of the buried electrode 5 in direct contact with P+ layers 31 and N+ layers 32 can be increased so that the contact resistance of the buried electrode 5 decreases.

According to the ninth embodiment, the N+ layers 32 of the anode layer 3a or the N-type layers 22 of the drift layer 2 can be widened so that the withstand voltage can be improved.

Figure 27:
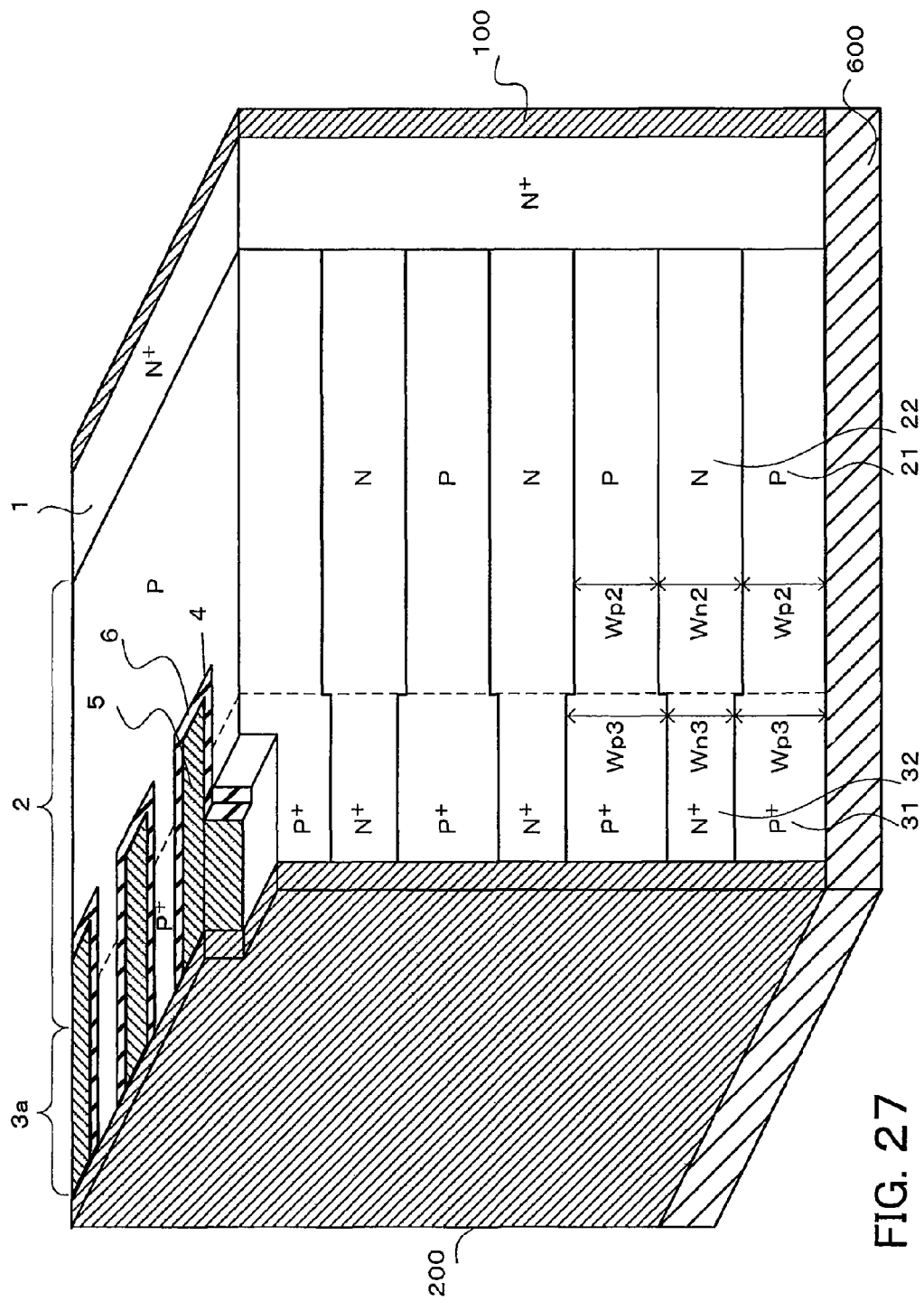
FIG. 27 is a perspective view schematically illustrating a configuration of a semiconductor device according to the tenth embodiment.

A tenth embodiment will be described with reference to FIG. 27. FIG. 27 is a perspective view schematically illustrating a configuration of a semiconductor device according to the tenth embodiment. FIG. 27 partially illustrates a section of the semiconductor device.

Although, the semiconductor device of the tenth embodiment has the same structure as the ninth embodiment basically, in the semiconductor device, a cathode layer 1, a drift layer 2 and an anode layer 3a are formed on a semiconductor layer 600 instead of the insulating layer 500 of the ninth embodiment.

According to the tenth embodiment, since the insulating layer 500 is not formed, manufacturing cost of the semiconductor device can be reduced. Further, because a semiconductor layer is better in heat transfer than a insulating layer usually, heat radiation of the semiconductor device can be improved.

Figure 28:
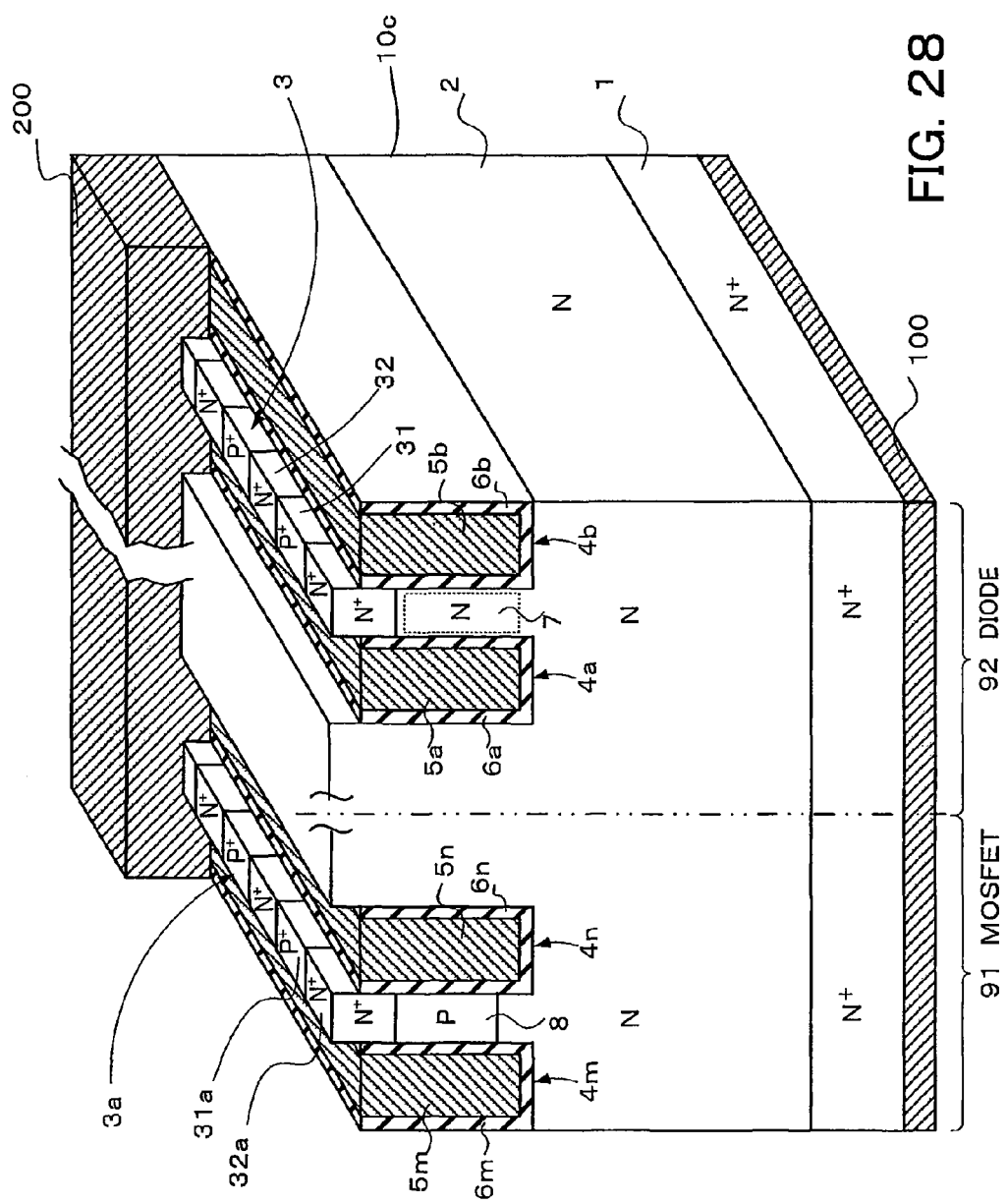
FIG. 28 is a perspective view schematically illustrating a configuration of a semiconductor device according to an eleventh embodiment.

In, the described embodiments, a silicon substrate or a silicon layer is used. A wide-gap semiconductor substrate or semiconductor layer such as SiC (silicon carbide), GaN (gallium arsenide) or diamond may be used instead of the silicon substrate or silicon layer. FIG. 28 illustrates an eleventh embodiment where a wide-gap semiconductor substrate 10c is employed.

FIG. 28 is a perspective view schematically illustrating a configuration of a semiconductor device according to the eleventh embodiment. FIG. 28 partially illustrates a section of the semiconductor device.

The semiconductor device of the eleventh embodiment is a reverse conducting MOSFET device formed on a SiC substrate. In the semiconductor device, a MOSFET 91, and a diode 92 electrically inverse-parallel-connected to the MOSFET 91 are formed on the SiC substrate 10c.

The MOSFET 91 is a trench gate type. Buried electrodes 5m, 5n are buried in trenches 4m, 4n formed in the SiC substrate 10c. Insulating films 6m, 6n are respectively interposed between the buried electrodes and the trenches. The buried electrodes 5m, 5n constitute a gate electrode. A P-type base layer 8 is formed between the trenches 4m, 4n. A P+ base contact layer 31a and an N+ source layer 32a, which constitute a universal contact layer 2a, are formed in the SiC substrate 10c.

In the diode 92, similarly to the first embodiment, a region 7 is provided between the trenches 4a, 4b. The diode 92 acts as a commutation diode that flows back a current flowing from an inductive load when the inductive load is connected.

An electrostatic breakdown voltage of SiC is about eight times as large as that of silicon, and thus, SiC can realize a compact and low-power-loss device. However, since SiC has a band gap as high as 3.2 eV, a normal PN-type diode using SiC has a high threshold. In the eleventh embodiment, the diode 92 is formed to have the same structure as the diode of the first embodiment illustrated in FIG. 2 so that the threshold of the diode 92 decreases.

Figure 29:
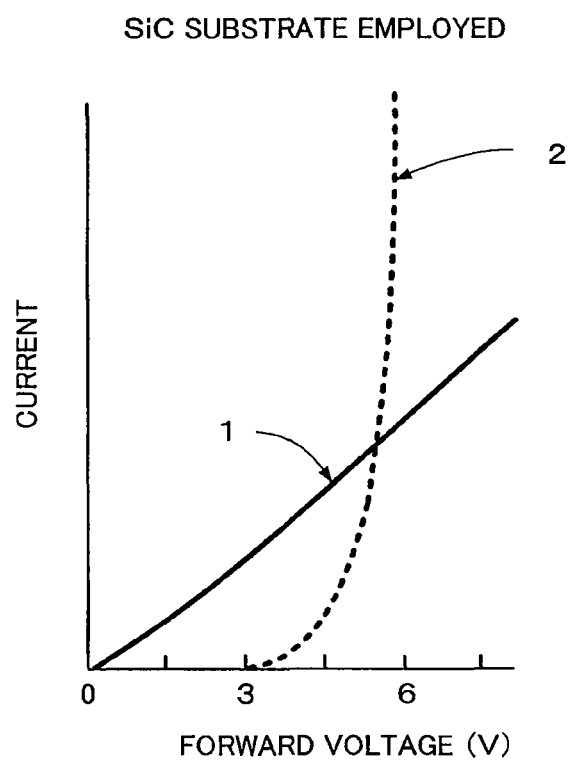
FIG. 29 is a view illustrating a simulation result as to a forward voltage-current characteristic of a diode unit of the semiconductor device according to the eleventh embodiment.

In FIG. 29, an example of a forward voltage-current characteristic of the diode 92 of the eleventh embodiment is shown by a solid line 1. In FIG. 29, for the purpose of comparison with the eleventh embodiment, a forward voltage-current characteristic of a conventional PN-type diode formed on a SiC substrate is shown by a dotted line 2.

As illustrated in FIG. 29, the conventional PN-type diode formed on the SiC substrate has a threshold of about 3 V. On the other hand, the threshold can be decreased up to about 0 V according to the diode 92 of the eleventh embodiment.

Figure 30A:
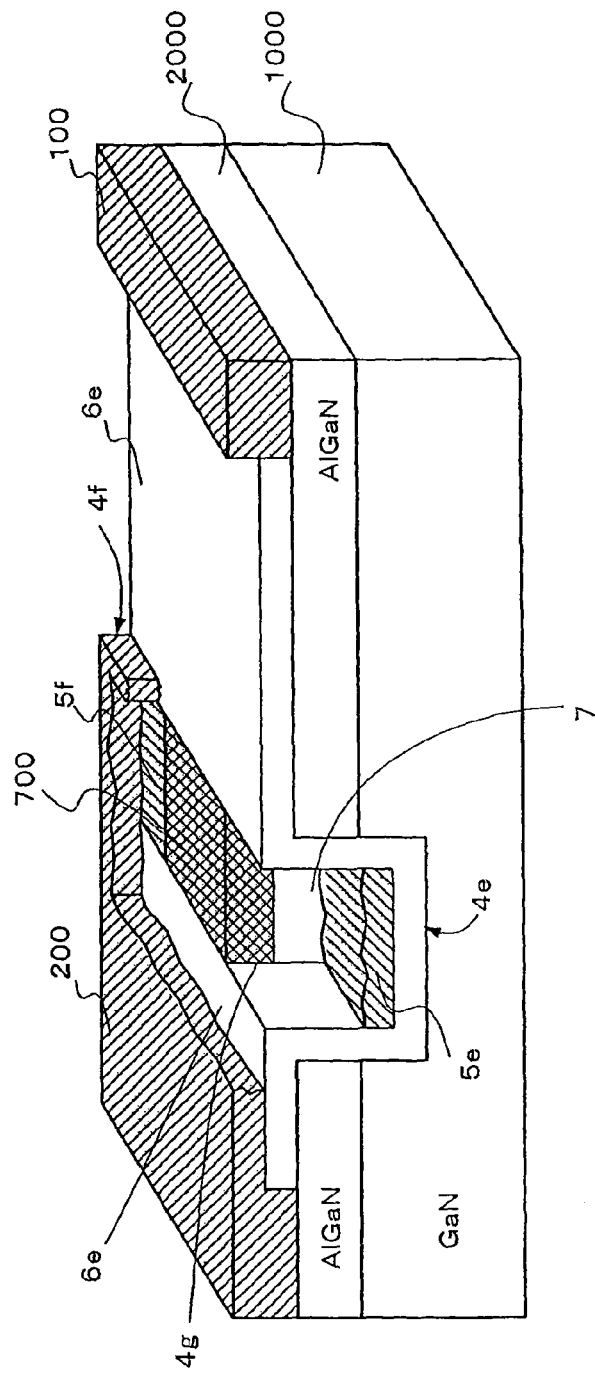
FIGS. 30A and 30B are a perspective view and a sectional view schematically illustrating a configuration of a semiconductor device according to a twelfth embodiment, respectively.
Figure 30B:
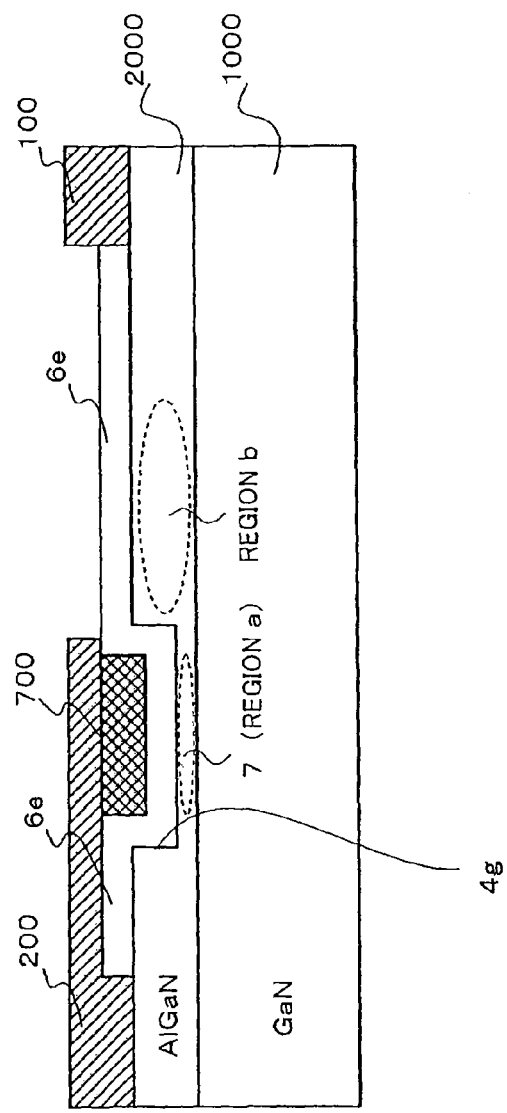

A twelfth embodiment will be described with reference to FIG. 30A. FIG. 30A is a schematic sectional view illustrating a configuration of a semiconductor device according to the twelfth embodiment. FIG. 30A partially illustrates a section of the semiconductor device. FIG. 30B a sectional view obtained by cutting the semiconductor device along an inter-trench region. The semiconductor device is a lateral diode formed on a GaN substrate.

In a GaN semiconductor device, a current flow is caused by a piezoelectric polarization induced two-dimensional electron gas, which is produced at a hetero interface between GaN and AlGaN (aluminum gallium nitride).

As illustrated in FIGS. 30A and 30B, in the semiconductor device of the twelfth embodiment, an AlGaN layer 2000 is formed on a GaN substrate 1000. A cathode electrode 100 is formed in one end portion of the AlGaN layer 2000, and is electrically connected to the AlGaN layer 2000. An anode electrode 200 is formed in the other end portion of the AlGaN layer 2000, and is electrically connected to the AlGaN layer 2000.

Trenches 4e, 4f are formed with an interval provided, in the AlGaN layer 2000 and the GaN substrate 1000 below the anode electrode 200. The trenches 4e, 4f extend from the AlGaN layer 2000 to the GaN substrate 1000. A shallow trench 4g is provided in the AlGaN layer 2000 and between the trenches 4e, 4f. A region 7 (region "a") of the AlGaN layer 2000 is formed so as to be sandwiched between the trenches 4e, 4f. An insulating film 6e is formed on inner walls of the trenches 4e, 4f and 4g and the AlGaN layer 2000 extensionally.

Buried electrodes 5e, 5f are formed in the trenches 4e, 4f so as to be in contact with the anode electrode 200. An electrode 700 is buried in the shallow trench 4g so as to be in contact with the anode electrode 200.

In the twelfth embodiment, the potential $\phi a$ of the region 7 (region "a") of the AlGaN layer 2000 between the trenches 4e, 4f can be changed by selecting the interval between the trenches 4e, 4f or the material for the buried electrodes 5e, 5f and 700, for example. The potential difference ($\phi b - \phi a$) between the region 7 (region "a") and a region (region "b") adjacent to the region 7 (region "a") in the AlGaN layer 2000 is set lower than the built-in voltage of GaN. It allows the threshold voltage of the semiconductor device of the twelfth embodiment to be decreased below the built-in voltage of a GaN junction.

Figure 31:
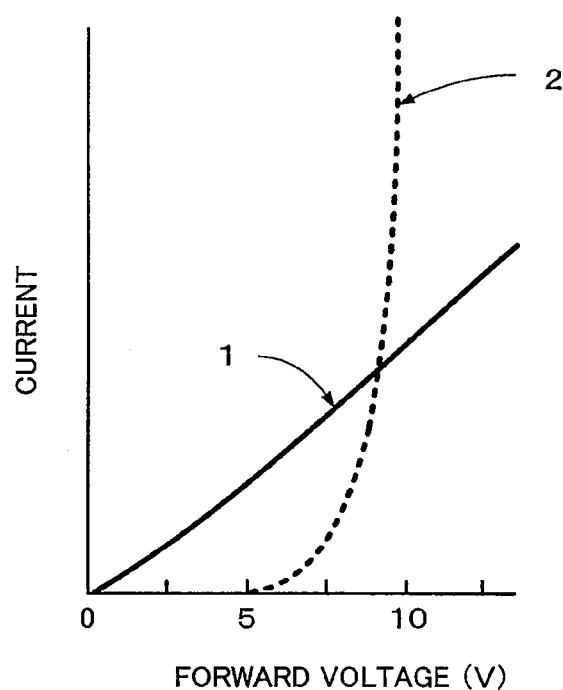
FIG. 31 is a view illustrated a simulation result as to a forward voltage-current characteristic of the semiconductor device according to the twelfth embodiment.

In FIG. 31, an example of a forward voltage-current characteristic of the twelfth embodiment is shown by a solid line 1. In FIG. 31, a forward voltage-current characteristic of a conventional PN-type diode formed on a GaN substrate is also shown by a dotted line 2, in order to compare with the twelfth embodiment.

As illustrated in FIG. 31, although the conventional PN-type diode formed on the GaN substrate has a threshold of about 5 V, according to the twelfth embodiment, the threshold can be decreased up to about 0 V.

In the above described embodiments, various modifications can be made. For example, in the super junction structure (multi RESURF structure) used in the drift layer of the first to tenth embodiments, a concentration distribution may be formed in a direction extending between the anode and the cathode, in order not only to guarantee a static withstand voltage of an element but also to increase a breakdown resistance such as an avalanche breakdown resistance.

In the third embodiment, the P-type layers 21 is substantially equal to the N-type layers 22 in the impurity concentration, and the P$^+$ layers 31 is substantially equal to the N$^+$ layers 32 in the impurity concentration.

When the P-type layers 21 differ from the N-types layer 22 in impurity concentrations, an effect similar to that of the third embodiment is obtained by replacing a ratio of the widths Wn2, Wp2 and a ratio of the widths Wn4, Wp4 with the ratios of the impurity amounts, respectively.

When the P$^+$ layers 31 differ from the N$^+$ layers 32 in impurity concentration, an effect similar to that of the third embodiment is obtained by replacing a ratio of the widths Wn3, Wp3 with the ratio of the impurity amounts.

In the above mentioned embodiments, the similar effect can be obtained when the impurity concentrations of the P$^+$ layers 31 and N$^+$ layers 32 of the anode layer 3a are decreased below the impurity concentrations of the P-type layers 21 and N-type layers 22 of the drift layer 2.

Further, a similar effect can be obtained when the impurity concentrations of the P-type layers 21 and N-type layers 22 in the region 23 of the third embodiment illustrated in FIG. 18 are decreased below the impurity concentrations of the P-type layers 21 and N-type layers 22 on the side of the cathode layer 1.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A semiconductor device comprising:
    a first region formed of semiconductor;
    a second region formed of semiconductor which borders the first region;
    an electrode formed to be in ohmic-connection with the first region; and
    a third region formed to sandwich the first region with the second region, wherein a first potential difference that is produced between the first and the second regions in a thermal equilibrium state is based on a second potential difference between the third region and the first region.

2. The semiconductor device according to claim 1, wherein
    a potential $\phi a$ of the first region in a thermal equilibrium state is set by at least one of a conductivity type of the first region, an impurity concentration of the first region, a material of the electrode, a conductivity type of the third region, or an impurity concentration of the third region, and the difference between the potential φa and a potential φb of the second region in a thermal equilibrium state is lower than a built-in voltage which depends on a band gap of the second region.

3. A semiconductor device comprising:
an anode electrode and a cathode electrode arranged with an interval between the electrodes;
a first-conductivity type cathode layer having a first impurity concentration, the cathode layer being formed on the cathode electrode;
a first-conductivity type drift layer formed on the cathode layer and having a second impurity concentration that is lower than the first impurity concentration;
a plurality of trenches formed at intervals in a portion of the drift layer on an anode electrode side;
a plurality of semiconductor regions, each semiconductor region extending between adjacent trenches;
an insulating film formed on each inner wall of the trenches;
a buried electrode provided in each of the trenches on the insulating film; and
a plurality of first-conductivity type layers and a plurality of second-conductivity type layers, the first-conductivity type layers alternating with the second-conductivity type layers provided between each semiconductor region and the anode electrode and contacting the semiconductor region, the first-conductivity type layers having a third impurity concentration that is higher than the second impurity concentration, the second-conductivity type layers having a fourth impurity concentration that is higher than the second impurity concentration,
wherein a first potential difference that is produced between the first-conductivity type drift layer and the plurality of semiconductor regions in a thermal equilibrium state is based on a second potential difference between the first-conductivity type drift layer and a region comprising the plurality of first-conductivity type layers and the plurality of second-conductivity type layers.

4. The semiconductor device according to claim 3, wherein the buried electrode provided in each of the trenches is electrically connected to the anode electrode.

5. The semiconductor device according to claim 3, wherein each semiconductor region has an impurity concentration that is higher than an impurity concentration of a portion of the first-conductivity type drift layer on a cathode electrode side.

6. The semiconductor device according to claim 3, wherein at least one of the semiconductor regions is a second conductivity type.

7. The semiconductor device according to claim 6, wherein the semiconductor regions includes a first-conductivity type semiconductor region and a second-conductivity type semiconductor region, ones of the buried electrodes arranged on both sides of the second-conductivity type semiconductor region is a gate of a MOSFET, the first-conductivity type semiconductor region is a portion of diode, and the MOSFET and the diode are electrically connected in reversely parallel.

8. The semiconductor device according to claim 3, wherein the buried electrode provided in each of the trenches is made of a same metal as the anode electrode.

9. The semiconductor device according to claim 3, wherein an insulating layer is buried in a portion of a space surrounded by each of the trenches and located on the anode electrode side, and the buried electrodes are provided in another portion of the space located on the cathode electrode side.

10. The semiconductor device according to claim 3, wherein
a potential φa of the semiconductor regions in a thermal equilibrium state is set by at least one of a conductivity type of the semiconductor regions, an impurity concentration of the semiconductor regions, a material of the buried electrode provided in each of the trenches, a material of the insulating film formed on each inner wall of the trenches, or an interval between the trenches, and
the difference between the potential φa and a potential φb of the first-conductivity type drift layer in a thermal equilibrium state is lower than a built-in voltage which depends on a band gap of a semiconductor material constituting the first-conductivity type drift layer, the first-conductivity type layers, and the second-conductivity type layers.

11. The semiconductor device according to claim 3, wherein the plurality of semiconductor regions constitutes a passage of a current flowing from the anode electrode when the device is biased in a forward direction, and
the passage of the current flowing from the anode electrode is pinched off by depletion layers extending from the trenches on both sides of each of the semiconductor regions when the device is biased in a reverse direction.

* * * * *